US008420978B2

(12) United States Patent
Jain et al.

(10) Patent No.: US 8,420,978 B2
(45) Date of Patent: Apr. 16, 2013

(54) HIGH THROUGHPUT, LOW COST DUAL-MODE PATTERNING METHOD FOR LARGE AREA SUBSTRATES

(75) Inventors: Kanti Jain, Urbana, IL (US); Junghun Chae, Champaign, IL (US); Sreeram Appasamy, North White Plains, NY (US)

(73) Assignees: The Board of Trustees of the University of Illinois, Urbana, IL (US); Anvik Corporation, Hawthorne, NY (US)

( * ) Notice: Subject to any disclaimer, the term of this patent is extended or adjusted under 35 U.S.C. 154(b) by 1057 days.

(21) Appl. No.: 11/624,505

(22) Filed: Jan. 18, 2007

(65) Prior Publication Data

US 2008/0176398 A1 Jul. 24, 2008

(51) Int. Cl.
*B23K 26/16* (2006.01)
*H01L 21/44* (2006.01)
*B29C 35/08* (2006.01)
*G21H 5/00* (2006.01)

(52) U.S. Cl.
USPC ........ 219/121.69; 438/674; 438/99; 438/455; 438/458; 427/555; 427/556

(58) Field of Classification Search .................. 438/674, 438/99, 455, 458; 219/121.69; 264/400; 427/555, 556
See application file for complete search history.

(56) References Cited

U.S. PATENT DOCUMENTS

| 4,334,349 A | 6/1982 | Aoyama et al. |
| 4,414,059 A | 11/1983 | Blum et al. |
| 4,568,632 A | 2/1986 | Blum et al. |
| 4,617,085 A | 10/1986 | Cole, Jr. et al. |
| 4,698,238 A | 10/1987 | Hayasaka et al. |
| 4,700,462 A | 10/1987 | Beaubien et al. |
| 4,780,177 A * | 10/1988 | Wojnarowski et al. ......... 216/45 |
| 4,842,677 A | 6/1989 | Wojnarowski et al. |
| 4,865,873 A | 9/1989 | Cole et al. |

(Continued)

FOREIGN PATENT DOCUMENTS

| TW | 0488028 B | 5/2002 |
| TW | I275184 | 3/2007 |

(Continued)

OTHER PUBLICATIONS

Kocabas et al. (2007) "Experimental and Theoretical Studies of Transport Through Large Scale, Partially Aligned Arrays of Single-Walled Carbon Nanotubes in Thin Film Type Transistors," *Nano Lett.* 7(5):1195-1202.

(Continued)

*Primary Examiner* — Henry Yuen
*Assistant Examiner* — Ket D Dang
(74) *Attorney, Agent, or Firm* — Lathrop & Gage LLP

(57) ABSTRACT

A high-throughput, low cost, patterning platform is provided that is an alternative to conventional photolithography and direct laser ablation patterning techniques. The processing methods are useful for making patterns of microsized and/or nanosized structures having accurately selected physical dimensions and spatial orientation that comprise active and passive components of a range of microelectronic devices. Processing provided by the methods is compatible with large area substrates, such as device substrates for semiconductor integrated circuits, displays, and microelectronic device arrays and systems, and is useful for fabrication applications requiring patterning of layered materials, such as patterning thin film layers in thin film electronic devices.

36 Claims, 10 Drawing Sheets

U.S. PATENT DOCUMENTS

| | | | |
|---|---|---|---|
| 4,877,644 | A | 10/1989 | Wu et al. |
| 4,959,326 | A | 9/1990 | Roman et al. |
| 4,985,116 | A | 1/1991 | Mettler et al. |
| 5,053,348 | A | 10/1991 | Mishra et al. |
| 5,155,053 | A | 10/1992 | Atkinson |
| 5,196,376 | A * | 3/1993 | Reche .............................. 216/18 |
| 5,232,549 | A | 8/1993 | Cathey et al. |
| 5,236,551 | A * | 8/1993 | Pan .................................. 216/19 |
| 5,278,385 | A | 1/1994 | Gerome et al. |
| 5,285,236 | A | 2/1994 | Jain |
| 5,514,618 | A * | 5/1996 | Hunter et al. ................... 438/30 |
| 5,679,472 | A | 10/1997 | Wu et al. |
| 5,702,565 | A * | 12/1997 | Wu et al. ....................... 264/400 |
| 5,908,719 | A | 6/1999 | Guckel et al. |
| 5,976,968 | A | 11/1999 | Dai |
| 6,140,226 | A | 10/2000 | Grill et al. |
| 6,277,318 | B1 | 8/2001 | Bower et al. |
| 6,289,751 | B1 | 9/2001 | Mathur et al. |
| 6,348,295 | B1 | 2/2002 | Griffith et al. |
| 6,355,399 | B1 | 3/2002 | Sajan et al. |
| 6,448,176 | B1 | 9/2002 | Grill et al. |
| 6,495,448 | B1 | 12/2002 | Lee |
| 6,593,687 | B1 | 7/2003 | Pei et al. |
| 6,714,810 | B2 | 3/2004 | Grzeszczuk et al. |
| 6,717,650 | B2 | 4/2004 | Jain |
| 6,962,771 | B1 | 11/2005 | Liu et al. |
| 6,988,925 | B2 | 1/2006 | Arthur et al. |
| 7,078,351 | B2 | 7/2006 | Chiu et al. |
| 7,095,484 | B1 | 8/2006 | Fries |
| 7,167,296 | B2 | 1/2007 | Meisburger |
| 7,180,575 | B2 | 2/2007 | Kasumi et al. |
| 7,196,005 | B2 | 3/2007 | Ho |
| 7,221,413 | B2 | 5/2007 | Lai |
| 7,264,990 | B2 | 9/2007 | Rueckes et al. |
| 7,349,035 | B2 | 3/2008 | Lai |
| 7,378,303 | B2 | 5/2008 | Shih et al. |
| 7,413,940 | B2 | 8/2008 | Lin |
| 7,426,006 | B2 | 9/2008 | Lai |
| 7,436,466 | B2 | 10/2008 | Lai |
| 7,547,590 | B2 | 6/2009 | Yang et al. |
| 2004/0038513 | A1* | 2/2004 | Kohl et al. .................... 438/619 |
| 2004/0125254 | A1 | 7/2004 | Chae et al. |
| 2005/0067286 | A1 | 3/2005 | Ahn et al. |
| 2005/0147895 | A1 | 7/2005 | Chang et al. |
| 2005/0158668 | A1 | 7/2005 | Bittner et al. |
| 2005/0185891 | A1 | 8/2005 | Kim et al. |
| 2006/0000814 | A1 | 1/2006 | Gu et al. |
| 2006/0063351 | A1 | 3/2006 | Jain |
| 2006/0091126 | A1 | 5/2006 | Baird et al. |
| 2006/0099731 | A1* | 5/2006 | Buckley et al. ................. 438/99 |
| 2006/0121639 | A1* | 6/2006 | Tai et al. ......................... 438/49 |
| 2006/0188721 | A1 | 8/2006 | Irvin, Jr. et al. |
| 2006/0289976 | A1 | 12/2006 | Min |
| 2007/0003878 | A1 | 1/2007 | Paxton et al. |
| 2008/0176398 | A1 | 7/2008 | Jain et al. |

FOREIGN PATENT DOCUMENTS

| | | | |
|---|---|---|---|
| TW | | 200744164 | 12/2007 |
| TW | | 200805431 | 1/2008 |
| TW | | 200807721 | 2/2008 |
| TW | | 200837840 | 9/2008 |
| TW | | 200917485 | 4/2009 |
| WO | WO 2004036663 | A2 * | 4/2004 |
| WO | WO 2005/086982 | | 9/2005 |

OTHER PUBLICATIONS

Lee et al. (Jul. 2005) "Sub-50 nm T-gate Pseudomorphic HEMTs Using Low Temperature Development Method," *Proceedings of 2005 5th IEEE Conference on Nanotechnology*, Nagoya, Japan.

Klosner et al. (Apr. 12, 2004) "Massively Parallel, Large-Area Maskless Lithography," *Applied Phys. Lett.* 84(15):2880-2882.

Chae et al. (Jan. 29, 2008) "Excimer Laser Projection Photoablation and Lift-Off Process for Patterning of Indium-Tin-Oxide for Cost Effective Fabrication of Flat-Panel Displays," *Proc. SPIE* 6911:69110P.

Choi et al. (2001) "Electrophoresis Deposition of Carbon Nanotubes for Triode-Type Field Emission Display," *Appl. Phys. Lett.* 78(11):1547-1549.

Choi et al. (1999) "Fully Sealed, High-Brightness Carbon-Nanotube Field-Emission Display," *Appl. Phys. Lett.* 75(20):3129-3131.

Dharap et al. (2004) "Nanotube Film Based on Single-Wall Carbon Nanotubes for Strain Sensing," *Nanotech.* 15:379-382.

Duley et al. (1996) "Interactions and Effects in Semiconductors," In; *UV Lasers: Effects and Applications in Materials Science*, Cambridge University Press, Cambridge, UK, pp. 308-356.

Fennimore et al. (Jul. 24, 2003) "Rotational Actuators Based on Carbon Nanotubes," *Nature* 424:408-410.

Huemoeller et al. (Jun. 2007) "Unveiling the Next Generation in Integrated Circuit Substrate Circuit Formation," *CircuiTree* 20(6):12-18.

International Search Report, Corresponding to International Application No. PCT/US07/78516, Mailed Mar. 27, 2008.

Jain, K. (1990) "Excimer Laser Etching and Deposition," In; *Excimer Laser Lithography*, SPIE Press, Bellingham, WA, pp. 176-189.

Jain et al. (Aug. 2005) "Flexible Electronics and Displays: High-Resolution, Roll-to-Roll, Projection Lithography and Photoablation Processing Technologies for High-Throughput Production," *Proc. IEEE* 93(8):1500-1510.

Jain et al. (Oct. 2002) "Large-Area, High-Resolution Lithography and Photoablation Systems for Microelectronics and Optoelectronics Fabrication," *Proc. IEEE* 90(10):1681-1688.

Jain et al. (Aug. 2002) "Large-Area Excimer Laser Lithography and Photoablation Systems," *Microlithography World* 11(3):8-10.

Klosner et al. (Jul. 2002) "High Resolution, Large Area Projection Lithography Offers a New Alternative for Wafer-Level Packaging," *Chip Scale Review* 6(4):75-81.

Liu et al. (Nov. 12, 2001) "Carbon Nanotube Field-Effect Inverters," *Appl. Phys. Lett.* 79:3329-3331.

Lu et al. (Jun. 21, 2006) "Nanotube Micro-Optomechanical Actuators," *Appl. Phys. Lett.* 88:253107.

Martel, R. (2002) "Nanotube Electronics: High-Performance Transistors," *Nature. Mat.* 1:203-204.

Meitl et al. (2004) "Solution Casting and Transfer Printing Single-Walled Carbon Nanotube Films," *Nano Lett.* 4(9):1643-1647.

Oh et al. (2003) "Room Temperature Fabrication of High-Resolution Carbon Nanotube Field-Emission Cathodes by Self-Assembly," *Appl. Phys. Lett.* 82(15):2521-2523.

Pasquier et al. (2005) "Conducting and Transparent Single-Wall Carbon Nanotube Electrodes for Polymer-Fullerene Solar Cells," *Appl. Phys. Lett.* 87:203511.

Srinivasan et al. (Sep. 15, 1982) "Self-Developing Photoetching of Poly(ethylene terephthalate) Films by Far-Ultraviolet Excimer Laser Radiation," *Appl. Phys. Lett.* 41:576-578.

Written Opinion, Corresponding to International Application No. PCT/US07/78516, Completed Jan. 24, 2008.

Chen et al. (Nov. 1999) "Electron Beam Lithography Process for T- and Γ-Shaped Gate Fabrication Using Chemically Amplified DUV Resists and PMMA," *J. Vac. Sci. Technol. B.* 17(6):2507-2511.

Chen et al. (2002) "Thin Film Patterning by Laser Lift-Off," *Jpn. J. Appl. Phys.* 41:3099-3100.

Grunbacher et al. (Jan. 1997) "Single Step Lithography for Double Recessed Gate Pseudomorphic High Electron Mobility Transistors," *J. Vac. Sci. Technol. B* 15(1):49-52.

Hayes et al. (2001) "A Laser-Ablation and Lift-Off Technique for Fabricating Simple Microfluidic Devices," *Proc. SPIE* 4236:115-125.

Hwu et al. (2003) "A Novel Double-Recesses 0.2-μm T-Gate Process for Heterostructire InGap-InGaAs Doped0CHannle FET Fabrication," *IEEE Electron. Dev. Lett.* 24(6):381-383.

Lee et al. (Jul. 2006) "Process for 20nm T Gate on $Al_{0.25}Ga_{0.75}As/In_{0.2}Ga_{0.8}As/GaAs$ Epilayer Using Two-Step Lithography and Zig-zag Foot," *J. Vac. Sci. Technol. B* 24(4):1869-1872.

Lin et al. (Jul. 2004) "Single Step Electron-Beam Lithography for Asymmetric Recess and Gamma Gate High Electron Mobility Transistor Fabrication," *J. Vac. Sci. Technol. B* 22(4):1723-1726.

Lu et al. (1995) "Laser-Induced Dry Lift-Off Process," *Jpn. J. Appl. Phys.* 34:L1669-L1670.

Mancini et al. (Aug. 2002) "T0Gate Fabrication for GaAs Processing," *Microthithography World*.

Molpeceres et al. (2005) "Microprossessing of ITO and a-Si Thin Films Using ns Laser Sources," *J. Micromech. Microeng.* 15:1271-1278.

Robin et al. (Nov. 2000) "Evolutionary Optimization of the Electron-Beam Lithography Process for Gate Fabrication of High Electron Mobility Transistors," *J. Vac. Sci. Technol. B* 18(6):3445-3449.

Tabatabaie-Alavi et al. (Aug. 2003) "Evolution of T-Shaped Gate Lithography for Compound Semiconductors Field-Effect Teansistors," *IEEE Trans. Semicon. Manufac.* 16(3):365-369.

Thompson et al. (Nov. 1990) "High Aspect Ratio Asymetric Gate Structures Employed in Novel Self0Aligned Electron Mobility Transistor Technology," *J. Vac. Sci. Tenol. B* 8(6):1339-1342.

Yavas et al. (1999) "High-Speed Maskless Laser Patterning of Thin Films for Giant Microelectronics," *J. Appl. Physi.* 38:7131-7134.

Yavas et al. (1999) "Effect of Substrate Absorption on the Efficiency of Laser Patterning of Indium Tin Oxide Thin Films," *J. Appl. Physi.* 85(8):4207-4212.

Noach et al. (1996) "Microfabrication of an electroluminescent polymer light emitting diode pixel array," *Appl. Phys. Lett.* 69(24):3650-3652.

Chae et al. (2007) "Patterning of Indium Tin Oxide by Projection Photoblation and Lift-off Process for Fabrication of Flat-Panel Displays," *Appl. Phys. Lett.* 90:261102.

Chae and Jain (Jul. 2008) "Excimer Laser Projection Photoablation Patterning of Metal Thin Films for Fabrication of Microelectronic Devices and Displays," *IEEE Photon. Tech. Lett.* 20(14): 1216-18.

Hogan (Sep. 2007) "Patterning Films with Fewer Steps," *Photon. Spectra* 112-113.

* cited by examiner

HIGH THROUGHPUT, LOW COST DUAL-MODE PATTERNING METHOD FOR LARGE AREA SUBSTRATES

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF INVENTION

Microfabrication and nanofabrication processing provide commercially attractive techniques for patterning structures comprising active and passive components of electronic, optical and optoelectronic devices and device arrays. The spectrum of available techniques include photolithography, soft lithography (e.g., contact printing), electron beam direct writing, and photoablation patterning methods. These techniques provide fabrication pathways for making, assembling and integrating large numbers of nanosized and or microsized structures comprising a variety of useful functional materials. Available techniques also provide a high degree of deterministic control over the physical dimensions and spatial arrangement of patterned structures and are compatible with processing a range of substrate materials, morphologies, and sizes. Microfabrication and nanofabrication fabrication techniques have been developed capable of accessing a range of useful device component and device array geometries, including complex three-dimensional multilayer thin film configurations.

Given the capabilities of microfabrication and nanofabrication processing, substantial research activities are currently directed toward enhancing application of these techniques for high resolution, dense patterning of large substrate areas. Substantial motivation for large area patterning applications originates from the rapidly expanding field of large area integrated electronics. Advances in materials strategies and fabrication techniques for thin film based electronics, for example, have played an essential role in the commercial development of a large area, dense integrated circuits and microelectronic systems having important applications for electronic displays, thin film photovoltaic systems, light emitting diode arrays, medical imaging systems and sensing technologies. Critical to the continued development and commercialization of this field, however, is the development of high through-put, low cost microelectronic and nanoelectronic processing techniques capable of large area and high resolution patterning and also capable of effective integration with existing device fabrication strategies and infrastructure.

Photolithography in combination with thin film deposition and etching processing provides a highly developed microfabrication platform for making large numbers (e.g., 10s of millions) of microstructures or micro-devices in the fabrication of a wide range of devices, including large area electronic devices. For example, this combination of processing techniques provides for the fabrication, assembly and integration of diverse classes of: (i) functional materials, including inorganic and organic semiconductors, dielectrics, conductors and optical active materials; (ii) active and passive device components, including transistors, capacitors, resistors, connectors and electrodes; and (iii) functional devices such as diodes, light emitting devices, and photovoltaics. These methods are compatible with processing diverse substrate materials, ranging from semiconductors, glasses, ceramics and polymer substrates, and processing functional substrates, such as printed circuit boards (PCB), display panels, and multi-chip modules. Photolithography techniques also enable patterning over a useful range of substrate areas ranging from a few square microns in microelectromechanical systems (MEMS) to a few centimeters in integrated circuits and up to few square meters in displays. As a result of these demonstrated performance attributes, photolithography is currently the most widely adopted microfabrication technique for the commercial fabrication of electronic and optoelectronic devices and device arrays.

In conventional photolithography, a substrate is coated or covered with a layer of photoresist (PR), for example via spin coating, linear coating, inkjet printing or vapor deposition methods. The PR is typically baked so as to stabilize the layer for subsequent processing steps. In subsequent photo-processing steps, the stabilized PR layer is illuminated with electromagnetic radiation having a selected, non-uniform spatial distribution of radiant energies. Typically, this is achieved using an optical mask have opaque features on a transparent background to generate an illumination pattern that corresponds to the optical mask geometry. The PR undergoes chemical changes in illuminated areas such that subsequent PR processing or development generates patterns in the photoresist corresponding to whether or not the region was masked. For example, exposure of a PR layer to electromagnetic radiation may cause polymer comprising the PR in the illuminated regions to become dissociated or cross-linked due to absorption of the radiant energy. In a subsequent development step, the illuminated PR is removed, for example by dissolution by developer, for negative PR materials, or the PR that is not illuminated is removed for positive PR materials. This developing processing step, therefore, provides a means of generating a pattern of exposed regions of the underlying substrate corresponding to illuminated or non-illuminated regions of the PR removed upon developing. Subsequent processing steps may include deposition and/or etching of the exposed regions of the substrate, wherein the PR functions as a mask to provide processing spatially restricted to the exposed regions of the substrate useful for patterning. The remaining PR on the material may be removed by stripper, resulting in a pattern of structures or features on the substrate. Two primary photolithography methods are currently in wide use for making microelectronic and optoelectronic devices: (i) contact printing methods, and (ii) projection imaging methods.

In contact printing methods, an optical mask is provided in mechanical contact with the PR layer is deposited on a surface of the substrate undergoing processing. This mask configuration enables patterning of the PR upon subsequent illumination and developing processing steps. There are significant disadvantages associated with this mask configuration, however, which impede commercial implementation of contact printing methods for applications requiring high resolution patterning. First, mechanical contact between mask and PR can introduce unwanted changes in the optical transmission properties of the mask, thereby undermining the pattern fidelity and resolution of the patterning achieved using this photolithographic technique. For example, mechanical contact between the PR layer may introduce optical defects and distortions capable of decreasing transmission of the illumination in specific portions of the mask, thereby resulting in pattern defects. Second, repeated mechanical contact between mask and PR layer results in mask degradation over time, thereby introducing pattern defects and limiting effective mask lifetime.

Given the disadvantages inherent to contact printing systems, projection imaging methods are more commonly used photolithographic patterning techniques for fabrication of integrated circuits, displays and other microelectronic products. These systems utilize an optical configuration avoiding direct contact of an optical mask with the PR layer to be patterned. Projection imaging systems consist of three principle components: (i) a light source for generating light having a desired wavelength, radiant energy and uniformity; (ii) optical components which transmit the light from source to substrate; and (iii) a stage part which holds substrate and moves exactly for pattern alignment. Optical components for light transmission in projection imaging photographic systems typically include a plurality of lenses to achieve uniform and exact alignment to the substrate. Two kinds of systems are principally used in projection imaging methods: scan projection-type systems and stepping-type projection systems.

In scan-type projection systems, illumination is scanned on the entire substrate area by moving the optical parts or moving the substrate. An advantage of scan-type projection is that it is capable of efficiently and simultaneously illuminating large substrate areas, thereby providing a fabrication platform compatible with some large-area patterning device applications, such as fabricating display devices or integrated circuits requiring patterning over large substrate areas. A disadvantage of scan-type projection methods, however, is the significant price of scan-type projection systems capable of large area patterning. For example, the price of critical optical components, such as lenses, can become prohibitively for large area scan-type projection systems, thus placing practical limitations on commercial implementation of this technique for some important applications.

In stepping-type projection systems, a substrate area to be patterned is divided into discrete segments that are successively and independently illuminated segment by segment. Multi-step processing providing a series of repeated patterns on a substrate is useful for some large area microelectronic device fabrication applications. The multi-step nature of processing in stepping-type projection methods, however, decreases total throughput and makes this technique susceptible to processing errors related to the alignment and registration of independently processed substrate segments. FIG. 1 provides a schematic diagram illustrating mechanical alignment and registration problems which can arise in stepping-type projection photolithography methods. As shown in this Figure, the substrate 41 is illuminated by three stepping shots 42, 43, and 44. If there is a misalignment (schematically shown as 45 in FIG. 1) in the first shot 42 and the second shot 43, the illumination energy (shown on the Y-axis 46 of the plot provided in FIG. 1) is doubled where the illumination is duplicated. As also shown in FIG. 1, however, this misalignment also results in a non-illuminated region between the second shot 43 and third shot 44, wherein the energy of illumination is zero. The patterns on the border area could be over-developed or under-developed because of this difference in illumination energy. In the case of fabrication TFT-LCD display devices, this non-uniform pattern in the substrate, as also known as a stitching problem, can result in unwanted non-uniform images. Substantial research attention is currently directed at addressing this problem.

To provide an alternative to photolithographic processing, complementary focused beam laser direct writing techniques, also commonly referred to as direct laser ablation methods, have been developed, and are currently used in some important microfabrication applications. In these techniques, direct patterning of selected areas on a substrate is achieved via illumination with focused laser electromagnetic radiation without the need for photoresist processing. Illumination is typically realized through an optical mask in a raster scanning fashion to expose specific portions of the substrate to focused laser electromagnetic radiation. The large radiant energies provided by the focused laser beam, initiate chemical reactions and physical processes resulting in ablative removal of material capable of absorbing laser electromagnetic radiation. Direct laser ablation methods provide a number of benefits including eliminating the need for a PR coating system, developing system, bake system and stripping system. Total fabrication times provided by laser ablation systems are also low due the direct nature of this patterning technique. For some patterning applications, these benefits significantly reduce the number of fabrication steps, thereby achieving a net reduction in fabrication costs and time. Implementation of direct laser ablation methods for making large area microelectronic applications, is currently restricted, however, due to significant limitations in the classes of materials that can be effectively patterned via laser ablation.

A number of studies have demonstrate the ability to directly pattern indium tin oxide (ITO) thin films via laser ablation methods. [See, e.g., O. Yavas and M. Takai, "Effect of Substrate Absorption on the Efficiency of Laser Patterning of Indium Tin Oxide Thin Films", Journal of Applied Physics, Vol. 85, (1999), pp. 4207-4212; O. Yavas and M. Takai, "High-Speed Maskless Laser Patterning of Thin Films for Giant Microelectronics", Journal of Applied Physics, Vol. 38 (1999), pp. 7131-7134; and C. Molpeceres, S. Lauzurica, J. L. Ocana, J. J. Gandia, L. Urbina and J. Carabe, "Microprocessing of ITO and a-Si thin films using ns laser sources", Journal of Micromechanics and Microengineering, 15 (2005) 1271-1278;]. As ITO is an important transparent conductor material useful in a range of device fabrication applications, these studies identify a potential to use direct laser ablation methods for making important large area microelectronic devices, such as flat panel display devices, photovoltaic arrays and large area sensors. O. Yavas and M. Takai report observation of wavelength dependent patterning characteristics of ITO films via laser ablation, wherein illumination with high energy ultraviolet electromagnetic radiation ($\lambda$=262 nm) is reported as capable of generating electrically isolating lines having smooth etch groove in a thin ITO film. These authors suggest the importance of strong absorption of the laser light by the substrate for the improved pattern morphology observed upon ultraviolet light irradiation. C. Molpeceres et al. also report effective ultraviolet laser ablation of thin films of indium tin oxide at $\lambda$=248 nm and 355 nm. These authors report fabrication of narrow ablation grooves with widths varying between 6 and 30 microns with processing velocities ranging from 1 mm s$^{-1}$ to 20 mm s$^{-1}$.

Despite the demonstrated capability of direct patterning of ITO films via laser ablation, these methods are susceptible to drawbacks which significantly hinder its commercial implementation in various device fabrication applications. First, patterning via direct ablation may result in the build up of ITO ablation debris on the substrate surface that can cause electrical shorts between patterned ITO features. Such ablation debris caused shorts can negatively affect device performance, for example, by causing a point or line defect in a microelectronic display device. Second, direct laser ablation of thin ITO films can result in unwanted exposure of the substrate to significant radiant energies of laser electromagnetic radiation. For application requiring ITO patterning on substrates prepatterned with electronic device components, such as thin film transistor components of microelectronic display devices, this exposure can result in unwanted changes in the electronic, optical and/or mechanical properties of device components underlying the patterned ITO layer. These changes can result in significant degradation of overall device capabilities and performance. Third, it is not clear that direct ablation methods are capable of providing the pattern linearity necessary for some device fabrication applications, such as In-Plane Switch (IPS) mode TFT-LCD systems, requiring very high resolution patterning of ITO components.

It will be appreciated from the foregoing that that there is currently a need for microfabrication and nanofabrication processing methods capable large area patterning of substrates to enable the rapidly developing class of large area integrated electronic systems. Processing methods are needed capable of generating high resolution, dense patterns of structures providing active and passive components of a variety of microelectronic devices. It will also be appreciated that a need exists for new methods of patterning important functional materials, such as indium tin oxide, for display systems, such as thin film transistor—liquid crystal display systems (TFT-LCD), organic light emitting displays (OLED) and plasma display panels (PDP).

SUMMARY OF THE INVENTION

This invention provides processing steps, methods and materials strategies for making patterns of structures for electronic, optical and optoelectronic devices. Methods of the present invention are complementary to conventional microfabrication and nanofabrication platforms, and can be effective integrated into existing photolithographic, etching and thin film deposition patterning strategies, systems and infrastructure. Methods of the present invention provide versatile fabrication pathways for making a range of useful structures and devices that eliminate complex, costly and time consuming photolithographic patterning and photoresist development processing steps.

Methods of the present invention provide a high-throughput, low cost, patterning platform that is an alternative to conventional photolithography and direct laser ablation patterning techniques. The present processing methods are useful for making patterns of microsized and/or nanosized structures having accurately selected physical dimensions and spatial orientation that comprise active and passive components microelectronic devices. Processing provided by the present methods is compatible with large area substrates, such as device substrates for semiconductor integrated circuits, displays, and microelectronic device arrays and systems, and is useful for fabrication applications requiring patterning of layered materials, such as patterning thin film layers in thin film electronic devices. The present methods are compatible with a range of patterned materials, including inorganic and organic semiconductors, conductors, optical functional materials (e.g., light emitting materials) and dielectrics, and are capable of making patterns of structures with high resolution, good pattern fidelity and high precision. In specific embodiments, methods of the present invention enable important processing steps and low cost fabrication strategies for patterning optically transparent layers, such as indium tin oxide layers or doped zinc oxide layers, on devices substrates prepatterned with device components, for example in the fabrication of large area display panel devices, such as TFT-LCDs, OLEDs and PDPs.

In one aspect, the present invention provides a method for generating a pattern of structures of a material using patterned laser ablation of a layer of photoablatable material provided on the surface of a substrate undergoing processing. In an embodiment, a layer of photoablatable material is provided on at least a portion of the substrate. In embodiments providing high resolution patterning, the layer of photoablatable material is provided in conformal contact with one or more surfaces of the substrate undergoing processing. Photoablatable material is removed from selected regions of the layer via patterned laser ablation in a manner generating a pattern of masked regions of the substrate and exposed regions of the substrate. Masked regions of the substrate are covered by the laser ablation patterned layer, and exposed regions of the substrate correspond to regions wherein material has been removed from the layer via patterned laser ablation processing. Material to be patterned on the substrate is subsequently provided to at least a portion of the exposed regions of the substrate, for example, via coating or deposition techniques, and the laser ablation patterned layer of photoablatable material is removed in a manner leaving at least a portion, and preferably for some applications substantially all, of the patterned material provided to the exposed regions of the substrate. This combination of processing steps generates a pattern of structures of the material on the substrate corresponding to the pattern of regions of the substrate exposed by the laser ablation patterned layer. The present methods are capable of generating patterns of structures comprising a variety of materials including conductive materials, metals, metal oxides and alloys, dielectrics, polymers, and semiconductors. Patterning methods of this aspect of the present invention are capable of being carried out repeatedly in a serial fashion for a given substrate to achieve multilayer patterning. Multilayer patterning is useful for making complex three dimensional patterns integrating structures having diverse compositions, spatial arrangements and physical dimensions.

In processing methods of the present invention, the laser ablation patterned layer functions as a mask, such as a deposition mask, enabling high resolution patterning of material provided to regions of the substrate exposed by the mask. For example, ablation conditions (e.g., radiant energies, radiant powers, wavelengths, composition and thickness of the layer of photoablatable material etc.) can be selected in the present invention so as to provide patterned laser ablation through the entire thickness of the layer. Such patterned laser ablation of the layer, therefore, generates a mask having a pattern of recessed features terminating in and exposing selected regions of the substrate. The pattern of recessed features in this mask layer provides access to selected regions of the substrate for subsequent processing steps, such as deposition or etching processing. As laser ablation provides a very high degree of control over the physical dimensions and spatial orientations of recessed features patterned into the layer of photoablatable material, the present invention provides processing capable of accessing very high resolution and precision patterning. The present methods include methods, for example, wherein the substrate is prepatterned with one or more device components and the recessed features of the laser ablation patterned layer are positioned such that they expose and terminate in underlying device components. Laser ablation patterned layers in these aspects may function as a deposition mask, for integrating the deposited patterned structures with underlying electronic, optical or optoelectronic device components. This aspect of the present invention is particularly useful for substrate processing applications requiring integration of patterns of structures having positions and spatial orientations that are aligned, in electrical contact or both aligned and in electrical contact with prepatterned underlying electronic device components supported by the substrate.

In embodiments of the present invention useful for thin film electronics applications, the processing step of providing an appropriate material, such as conductive material, to the substrate comprises depositing at least one thin film comprising the appropriate material(s) onto the pattern of exposed regions of the substrate. In some embodiments, for example, thin film deposition is provided to a laser ablation patterned layer having a pattern of recessed features exposing selected regions of the substrate. One or more thin films of the desired material to be patterned is deposed on the exposed regions of the substrate and onto the external surface of the laser ablation patterned layer. Subsequent removal of the photoablatable layer in the present methods provides for material lift-off the portion of the thin film of the material provided onto the external surface of the laser ablation patterned layer. Accordingly, the laser ablation patterned layer functions as a sacrificial layer in addition to functioning as a deposition mask. Material lift-off is selective in the present methods, however, such that at least a portion, or preferably for some embodiments substantially all, of the thin film of the material deposited on the exposed regions of the substrate is not removed. Selective lift-off may be provided by a variety of techniques in the present methods, for example via chemical dissolving (e.g., stripping) or mechanical removal of the laser ablation patterned layer, laser ablation removal of the laser ablation patterned layer or a combination these techniques. In lift-off methods of the present invention using laser ablation processing, the ablation patterned layer of photoablatable material is exposed to electromagnetic radiation transmitted by material to be patterned on the substrate provided on top of the layer. In these embodiments, electromagnetic radiation transmitted by material has sufficient radiant energies and wavelengths to initiate ablative removal of the layer.

The present patterning methods provide a number of advantages over conventional photolithography and direct laser ablation processing. First, definition of the laser ablated patterned layer serving as the mask is carried out in the present invention via a single, efficient laser ablation processing step. In contrast to conventional photolithographic patterning, this has the advantage of eliminating some of the photolithographic processing and material etching steps, thereby reducing net processing time and costs. Second, laser ablation in the present invention is used to pattern a mask layer of photoablatable material provided to the substrate, in contrast to direct ablation methods requiring ablation of the material patterned onto the substrate. Laser ablation of the mask layer, as opposed to the patterned material itself, allows materials strategies and ablation conditions to be optimized to achieve a number of processing benefits. For example, this processing strategy provides flexibility as to the composition of the material patterned onto the substrate surface by allowing effective patterning of materials that are not easily ablated, such as indium tin oxide thin films. Further, a suite of processing conditions, including the composition and thickness of the layer of photoablatable material, ablation wavelength and ablation radiant energies, can be more effectively optimized in the present invention to access high resolution and high throughput patterning than in conventional direct laser ablation patterning techniques.

In another aspect, the present invention provides a number of novel processing strategies for providing material lifting off of the material provided on the laser ablation patterned layer serving as a mask in present patterning methods. The present processing strategies provide selective material lift-off of the material provided on the ablation patterned mask layer without removing or degrading material patterned on the substrate surface. In one embodiment, for example, removal of the laser ablation patterned photoablatable layer is achieved by exposing the ablation patterned mask layer to electromagnetic radiation capable of initiating laser ablation of all of, or a portion of, the mask layer. In contrast to the patterned laser ablation processing steps of the present invention, laser ablative removal of the laser ablation patterned layer is preferably, but not necessarily, carried out via flood exposure (i.e., not using an optical mask) providing substantially spatially uniform (e.g. within about 20%) radiant energies to the laser ablation patterned layer. In some of these embodiments, use of a material for patterning that is optically transparent to electromagnetic radiation providing ablation of the laser ablation patterned is preferred so as to facilitate delivery of large radiant energies to the laser ablation patterned layer undergoing removal. Accordingly, use of optically transparent thin films is beneficial in the present invention for realizing lower net processing times. Optically transparent materials useful in patterning methods of the present invention include, but are not limited, thin films of indium tin oxide, indium oxide, doped indium oxide, tin oxide, doped tin oxide, zinc oxide, doped zinc oxide and carbon films.

The present invention also provides processing steps combining laser ablation and chemical dissolving (e.g., stripping) that are capable of providing effective material lift-off without exposing the underlying substrate, and optionally device components prepatterned thereon, to radiant energies capable of causing damage or degradation. In these embodiments, the laser ablation patterned mask layer is exposed to a radiant energy of electromagnetic radiation sufficient to remove an ablated portion of the layer that does not extend the entire thickness of the layer, for example ablative removal of the top portion of the layer. Use of laser ablation in the present invention is beneficial because this technique is capable of providing precise control of the depth to which a photoablatable material or layer of photoablatable material is abalated. In some embodiments, for example, the ablated portion of the mask layer is large enough to provide for materials lift-off of the material deposited on the external surface of the layer, and the portion of the laser ablation patterned layer remaining on the substrate is subsequently removed by chemical dissolution using an appropriate solvent or physical removal process, such as wet etching or plasma etching. Partial laser ablation in these processing strategies, therefore, avoids exposure of the underlying substrate, and optionally device components prepatterned thereon, to the large radiant energies employed during conventional laser ablation removal of the laser ablation patterned mask layer. This feature of the present invention is particularly beneficial for processing thin film transistor device substrates, as transistor electronic characteristics can be significantly affected via exposure to large radiant energies. In addition, partial ablation initiated lift-off also reduces the net number of laser pulses required for processing. This is beneficial as it reduces exposure of the optics of the processing system to electromagnetic radiation resulting in an increase the lifetimes of optical components of these systems. Useful methods of this embodiment include, but are not limited to, ablation of an external portion (i.e., portion distal to the surface of the substrate undergoing processing) of the laser ablation patterned mask layer that extends between about 10% and about 50% of the entire thickness of the layer, and/or ablation of an external portion (i.e., portion distal to the surface of the substrate undergoing processing) of the laser ablation patterned mask layer that extends between about 100 nanometers to a few microns into the layer.

In an embodiment useful for fabrication of display panel devices, the present invention provides methods for patterning a substrate with one or more thin films of an optically transparent conductor, such as indium tin oxide. As discussed above, optical transparency in this context refers to the ability of the deposited conductor layer to transmit incident electromagnetic radiation sufficient to provide partial, or complete, laser ablation of an underlying patterned mask layer of photoablatable material so as to provide effective materials lift-off processing. For patterning applications involving indium thin oxide thin films, use of a XeF excimer laser is useful for providing for effective removal of the underlying laser ablation patterned mask layer and providing ablative lift-off, as indium tin oxide has a large percentage transmission (i.e., greater than or equal to about 40%) at 351 nm. Use of a XeF excimer laser sources in these methods is also beneficial because a large number of photoablatable materials, including photoablatable polymers, are available that undergo effective ablation at 351 nm. In some embodiments, patterned indium tin oxide films have thicknesses less than or equal to about 100 microns so as to ensure effective transmission of electromagnetic radiation used in laser ablation lift-off processing steps. This aspect of the present invention is particularly useful for fabricating a range of display device systems, including thin film transistor—liquid crystal display devices, organic light emitting display devices and plasma display panel devices.

Selection of useful photoablatable materials in the present methods may be made on the basis of a number of physical and chemical properties, including optical absorption spectrum, mechanical properties, ease of removal (e.g., availability of solvents and/or stripping agents capable of removal) and lift-off characteristics. It is preferable, however, the photoablatable material absorb sufficiently to undergo ablation at wavelengths corresponding to existing visible, ultraviolet and infrared laser sources, for example ablation sources currently used in direct ablation patterning techniques. Given these considerations, a wide range of photoablatable materials are useful in the present methods including, but not limited to, photoablatable polymers, such as photoresist or, polymethylmethacrylate (PMMA), polyimide, poly ethylene terephathalate, polystyrene, polycarbonate, polybenzimidazole, tetrafluoroethylene, polyester, cellulose acetate and polymethyl isopropenyl ketone (PMIPK). Use of photoablatable polymers for mask layers in the present methods provide a number of benefits. First, these materials may be applied to substrate surfaces via a range of commercially attractive methods compatible with existing substrate processing equipment, processing strategies and process conditions. Useful methods for applying photoablatable layers to the surfaces of substrates undergoing processing include casting methods, spin coating, spraying, ink jet printing, linear coating, and vapor deposition techniques. Second, photoablatable polymers, including conventional photoresists, are available that can be removed effectively using conventional development techniques such as chemical dissolving or removing (e.g., dissolution and/or stripping processing using an appropriate solvent), and provide effective lift-off properties. Third, photoablatable polymers are available that absorb strongly at wavelengths corresponding to useful ultraviolet and visible laser ablation sources, such as excimer lasers and UV and visible solid state lasers. Fourth, the required laser fluence for polymer ablation is very low compared with that for inorganic materials, such as oxides and metals. The low-fluence illumination can significantly lower or eliminate the damage on underlying structure or device, and lower the equipment cost for generating the illumination. Accordingly, many of these materials are capable of effective laser ablation removal and lift-off processing with low illumination radiant energies.

In a method of the present invention, the layer of photoablatable material is provided in physical contact with the surface of the substrate undergoing processing. In some embodiments useful for very high resolution patterning, the layer of photoablatable material is provided in conformal contact with the surface of the substrate undergoing processing. In an embodiment, the layer of photoablatable material provided to the substrate has a thickness selected from the range of about microns to hundreds of microns. Use of layers having thicknesses less than about 100 microns is preferred for some embodiments because it can be patterned via laser ablation quickly, thereby accessing shorter net processing times, and also is compatible with efficient and fast removable via dissolution and/or photoablation initiated lift-off. In some embodiments, a layer of photoablatable material is provided having a substantially uniform thickness (e.g. uniform within about 10%). Present invention includes, however, use of photoablatable layers having a selectively varying non-uniform thickness, for example provided by tilting the substrate during application of the photoablatable material.

Methods of the present invention may further comprise the step of stabilizing the layer of photoablatable material provided on the substrate. Stabilization of the photoablatable layer is beneficial for ensuring good pattern fidelity by minimizing lateral movement and/or transport of photoablatable material in the layer during substrate movement to the next process, laser ablation, deposition and lift-off processes. Stabilization may be carried out in the present methods by any means known in the art such as initiating a change in phase or composition (e.g. cross linking polymers comprising the photoablatable layer) of the layer, for example by curing or baking. In an embodiment, the methods of the present invention comprise the steps of: (i) contacting the photoablatable material in a fluid state with a surface of the substrate, and (ii) subsequently curing the photoablatable material in contact with the substrate. Present invention includes, however, use of photoablatable materials capable of application and/or stabilization without requiring a curing processing step.

Patterned laser ablation can be carried out in the present invention via any technique capable of generating a pattern of masked and exposed substrate regions useful for a selected substrate processing application. Selection of an ablation wavelength that is strongly absorbed by the photoablatable material is useful for accessing lower net processing times and, thus high throughput. Further, selection of an ablation wavelength that is not significantly absorbed by the underlying substrate is beneficial for avoiding photoinitiated degradation of the substrate or device components prepatterned on the substrate prior to patterning. The present invention includes, but is not limited to, use of pulsed or continuous laser ablation using ultraviolet, visible or infrared electromagnetic radiation having radiant energies selected from the range of about 10 mJ cm$^{-2}$ to several J cm$^{-2}$.

In an embodiment, patterned laser ablation of the layer of photoablatable material comprises the steps of: (i) providing a laser for generating laser electromagnetic radiation; (ii) providing an optical mask positioned between the laser and the layer of photoablatable material, wherein the optical mask comprises a pattern of transmissive regions and non-transmissive regions; and (iii) illuminating the optical mask with electromagnetic radiation, wherein a transmitted portion of the electromagnetic radiation is transmitted by the transmissive regions of the optical mask and is provided to the layer of photoablatable material. Use of an optical mask in combination with a laser source in this embodiment of the present invention is useful for generating non-uniform spatial distribution of radiant intensities of electromagnetic radiation provided to the layer of photoablatable material capable of generating a selected pattern of exposed and masked regions of the substrate.

A variety of techniques are applicable in the present invention to provide the desired material to be patterned to the exposed regions of the substrate undergoing processing, including but not limited to, coating, spraying, printing and deposition techniques such as thin film deposition. In some embodiments, deposition is preferably carried out at a temperature low enough to avoid degradation of the layer of photoablatable material during processing, for example a temperature below the baking temperature of a photoresist comprising the photoablatable layer. Useful coating and deposition techniques include, but are not limited to, chemical vapor deposition, physical vapor deposition, sol-gel coating, sputtering deposition, electron beam deposition, plasma chemical vapor deposition; sputtering deposition; and atomic layer deposition. Useful printing techniques include ink jet printing.

Deposition techniques providing precise control over the thickness of deposited thin films of are preferred for electronic device fabrication applications requiring high precision. The present methods are compatible with deposition of thin films having a wide range of thicknesses, for example, thicknesses selected from the range of 10s of Angstroms up to 10s of microns. A wide range of materials are useful in the present patterning methods including, but not limited to, conductive materials such as copper, aluminum, chromium, nickel, titanium, tungsten, gold, tin, zinc, indium or an alloy or oxide thereof. Use of conductive material that is optically transparent in ultraviolet or visible regions of the spectrum, such as indium tin oxide, indium oxide, doped indium oxide, tin oxide, doped tin oxide, zinc oxide, doped zinc oxide and/or carbon film, is particularly beneficial in methods of invention for making display devices and integrated circuits. As will be apparent to those having skill in the art of microfabrication, the methods of the present invention are compatible with patterning a wide range of materials including conductive materials, semiconductors, dielectric materials, and polymer materials.

The present methods are highly versatile and can be used to generate structures and patterns of structures having a variety of physical dimensions. The present invention includes, but is not limited to, methods capable of making patterns of structures with physical dimensions selected over the range of about 100 nanometers to about few millimeters. Some embodiments, for example, are capable of fabricating patterns of thin film structures having thicknesses selected over the range of 10s of nanometers to 10s of microns. The present methods are capable of patterning a wide range of substrate areas including, but not limited to, substrate areas ranging from about 10s of nanometers$^2$ to several meters$^2$.

In another aspect, the present invention comprises a range of devices, including large area microelectronic systems, made by the methods of the present invention including, but not limited to, display devices and device arrays, such as TFT-LCDs, OLEDs and PDPs, semiconductor integrated electronic circuits, thin film electronic systems, sensors and sensor arrays, complementary logic circuits, information storage devices, medical imaging systems, photovoltaic arrays and systems, optical systems such as light emitting diode arrays, a microfluidic system, a nanofluidic system, a nanoelectromechanical system and a microelectromechanical system. In an embodiment, the present invention provides methods, structures and systems for providing optical chip-to-chip communication in an integrated electronic circuit.

In another aspect, the present invention provides a method for generating a pattern of structures of a desired material on a substrate comprising the steps of: (i) providing a layer of photoablatable material on at least a portion of the substrate; (ii) removing photoablatable material from selected regions of the layer of photoablatable material via patterned laser ablation; thereby generating masked regions of the substrate masked by the layer of photoablatable material and exposed regions of the substrate; (iii) depositing the material on at least a portion of the exposed regions of the substrate; and (iii) removing the photoablatable layer, thereby generating the pattern of structures of the material on the substrate.

In another aspect the present invention provides a method for generating a pattern of structures of a desired material on a substrate comprising the steps of: (i) providing a layer of photoablatable material on at least a portion of the substrate; (ii) removing photoablatable material from selected regions of the layer of photoablatable material via laser ablation; thereby generating regions of the substrate masked by the layer of photoablatable material and exposed regions of the substrate; (iii) depositing a thin film of the material on at least a portion of the exposed regions of the substrate and on the layer of photoablatable material; and (iii) exposing the layer of photoablatable material to a radiant energy of electromagnetic radiation sufficient to initiate laser ablation of at least a portion of the layer, wherein ablation of the layer lifts off material deposited on the layer of photoablatable material and does not remove at least a portion of the thin film of the material deposited on the exposed regions of the substrate, thereby generating the pattern of structures of the material on the substrate. Optionally, methods of this aspect further comprise the steps of (i) exposing the layer of photoablatable material to a radiant energy of the electromagnetic radiation sufficient to remove an ablated portion of the layer, wherein the ablated portion does not extend the entire thickness of the layer, thereby lifting off material deposited on the layer of photoablatable material; and (ii) exposing the layer of photoablatable material having the ablated portion to chemicals (e.g., solvent) capable of removing the photoablatable material, for example via dissolution and/or stripping, thereby generating the pattern of structures of the material on the substrate.

In another aspect, the present invention provides a method for generating a pattern of structures of an optically transparent conductive material on a display device substrate comprising the steps of: (i) providing a layer of photoablatable material on at least a portion of the display device substrate; (ii) removing photoablatable material from selected regions of the layer of photoablatable material via laser ablation; thereby generating regions of the display device substrate masked by the layer of photoablatable material and exposed regions of the display device substrate; (iii) depositing the optically transparent conductive material on at least a portion of the exposed regions of the display device substrate; and (iv) removing the photoablatable layer, thereby generating the pattern of structures of the optically transparent conductive material on the display device substrate. In an embodiment of this method, the composition of the photoablatable material is selected such that it is capable of undergoing photoablation at a wavelength at which the optically transparent material is transmissive. In an embodiment of this method, the display device substrate comprises thin film transistor electronic device components supported by a substrate, and the structures of the optically transparent conductive material are positioned such that they are in electrical contact with or both of one or more of the thin film transistor electronic device components of the display device substrate.

DETAILED DESCRIPTION OF THE INVENTION

Figure 1:
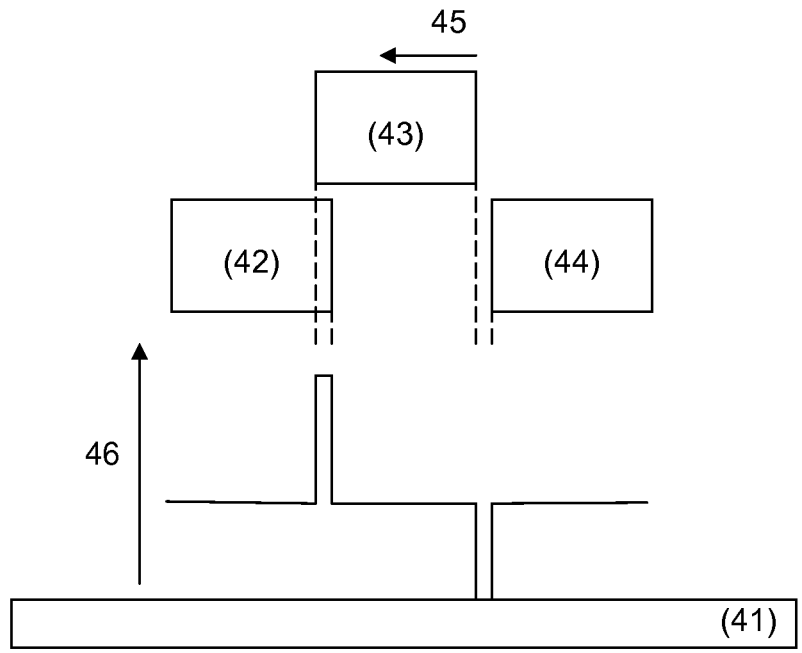
FIG. 1 provides a schematic diagram illustrating mechanical alignment and registration problems which can arise in stepping-type projection photolithography methods.

Referring to the drawings, like numerals indicate like elements and the same number appearing in more than one drawing refers to the same element. In addition, hereinafter, the following definitions apply:

The term "electromagnetic radiation" and "light" are used synonymously in the present description and refer to waves of electric and magnetic fields. Electromagnetic radiation useful for the methods of the present invention include, but is not limited to ultraviolet light, visible light, infrared light, or any combination of these.

"Beam of electromagnetic radiation beam" refers to electromagnetic radiation propagating in substantially the same direction (i.e. beam divergence less than 5 degrees ). In the present description, use of the term beam of electromagnetic radiation is intended to be consistent with use of this term in the art of optics, opto-electronics and spectroscopy. Beams of electromagnetic radiation beam useful in the methods of the present invention include coherent beams of electromagnetic radiation, pulses of electromagnetic radiation and continuous wave beams of electromagnetic radiation. Beams of electromagnetic radiation useful in the present methods may be focusing, diverging, collimated, semicollimated or noncollimated.

"Lift-off" refers to a substrate processing step wherein material is removed by removing a sacrificial layer provided underneath the material to be removed and supported by the substrate.

"Photoablatable" refers to a material that is capable of undergoing photoablation. Photoablation refers to a process wherein material is removed upon exposure to high radiant energies (e.g., greater than 10 mJ cm$^{-2}$) of electromagnetic radiation. In some photoablation processing methods, a large number of incident photons are delivered to a localized region of a layer of material over a very short time frame initiating a complex and rapid series of physical and chemical processes, including bond breaking and phase change processes. These processes cause a highly localized and unsustainable increase in volume and pressure resulting in ablation wherein material is release from the layer, for example in an ablation plume.

"Polymer" refers to a molecule comprising a plurality of repeating chemical groups, typically referred to as monomers. Polymers are often characterized by high molecular masses. Polymers useable in the present invention may be organic polymers or inorganic polymers and may be in amorphous, semi-amorphous, crystalline or partially crystalline states. Polymers may comprise monomers having the same chemical composition or may comprise a plurality of monomers having different chemical compositions, such as a copolymer. Cross linked polymers having linked monomer chains are particularly useful for some applications of the present invention.

"Fidelity" refers to a measure of the similarity of a pattern transferred to a substrate surface and a relief pattern on a patterning device. Good fidelity refers to similarities between a pattern transferred to a substrate surface and a relief pattern on a patterning device characterized by deviations less than 100 nanometers.

"Sacrificial layer" refers to a layer that supports one or more structural layers and is ultimately removed during fabrication to form a structure or pattern of structures.

"Conformal contact" refers to contact established between one or more surfaces, including contact between the surface of a layer provided on a substrate surface undergoing processing. In one aspect, conformal contact involves a macroscopic adaptation a layer of photoablatable material to the overall shape of a substrate surface. In another aspect, conformal contact involves a microscopic adaptation of a layer of photoablatable material to a substrate surface leading to an intimate contact with out voids. The term conformal contact is intended to be consistent with use of this term in the art of lithographic patterning.

In the following description, numerous specific details of the devices, device components and methods of the present invention are set forth in order to provide a thorough explanation of the precise nature of the invention. It will be apparent, however, to those of skill in the art that the invention can be practiced without these specific details.

The present invention provides methods and systems for patterning substrates which can be used in microelectronic fabrication processing for making integrated circuits (IC) and microelectronic devices and device arrays. The application of this technology is particularly well suited for display panel fabrication such as TFT-LCD (Thin Film Transistor-Liquid Crystal Display), OLED (Organic Light Emitting Display) and PDP (Plasma Display Panel). The present methods provide an alternative to conventional lithography and etching methods due to several important advantages: the patterns in microelectronics fabrication can be generated with (1) lower fabrication cost; (2) higher fabrication speed; (3) lower system cost; (4) smaller footprint in fabrication plant; and (5) lower maintenance time for equipments.

Figure 2:
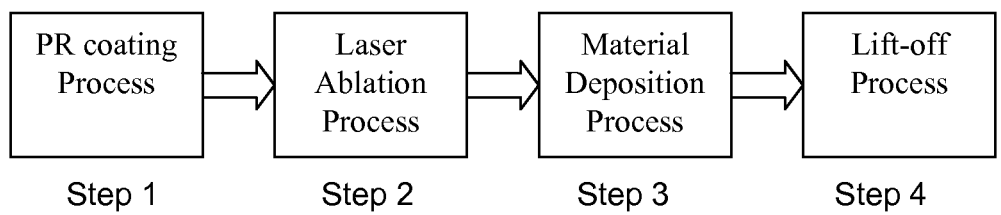
FIG. 2 provides a schematic process flow overview of a method of the present invention for making a pattern of structures on a substrate.

In an embodiment, the invention provides a patterning method using a laser beam ablation and lift-off method, which can pattern large size microelectronic circuits, displays or semiconductor wafers with high production speeds, high resolution and low fabrication cost. FIG. 2 provides a schematic process flow overview of this embodiment. As shown in this figure, the invention comprises a sequential series of processes (Steps 1-4) including: (1) coating a substrate surface with a photoablatable polymer at desired thickness and then curing the polymer to stabilize the polymer; (2) make a pattern in the photoablatable polymer by patterned laser ablation; (3) depositing any kind of materials which is not dissolved or removed during following lift-off process; (4) lift-off process to remove the polymer layer by wet chemical processing, laser ablation processing or both.

Step 1 corresponds to a photoablatable polymer coating processing of the method wherein a photoablatable polymer (e.g., photoresist) layer 51 is coated on the substrate 50 to be patterned. The requirement of the polymer is that it is capable of patterned ablation by laser illumination. The examples of polymers that can be ablated by laser included, but are not limited to, polymethylmethacrylate, polyimide, polyethylene terephthalate, polystyrene, polycarbonate, polybenzimidazole, tetrafluoroethylene, and conventional photoresists (PR).

In an embodiment, the photoablatable polymer layer is baked (cured) at 50~200° C. to enhance stability for next processes. The thickness of the photoablatable polymer layer can be varied by spin rpm in case of spin coating method, or amount of spraying in case of linear coating method. The temperature of baking depends on the type of polymer employed for processing. The present invention includes use of a polymer that does not need curing process.

Figure 3:
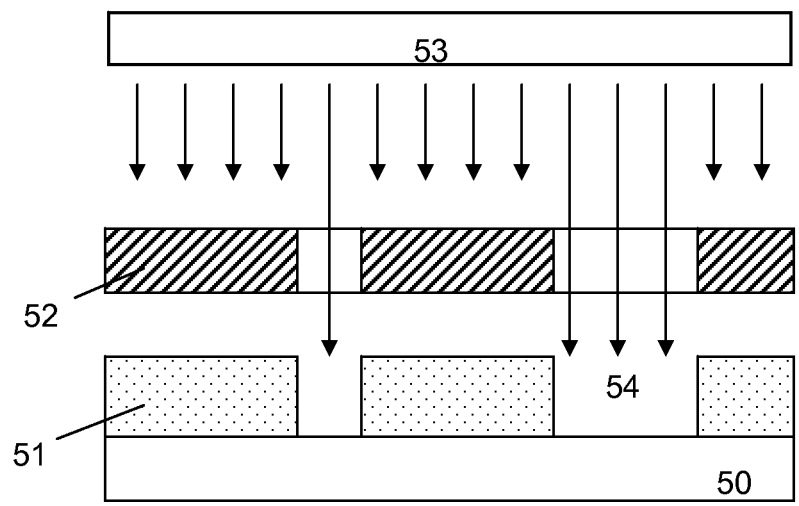
FIG. 3 provides a schematic diagram illustrating patterned laser ablation of the PR layer provided to the substrate.

Step 2 corresponds to the laser ablation and patterning processing of the method. FIG. 3 provides a schematic diagram illustrating patterned laser ablation of the photoablatable polymer layer provided to the substrate. The stabilized photoablatable polymer layer 51 on the substrate 50 is illuminated by laser 53. As shown in FIG. 3, laser electromagnetic radiation passed through optical mask 52 having a plurality of transmissive and nontransmissive regions and is provided to photoablatable polymer layer 51. For the sake of illustration, electromagnetic radiation from laser 53 is shown schematically by arrows provided in FIG. 3. During the laser ablation process, laser electromagnetic radiation transmitted through the transparent regions of the mask 52 is incident on photoablatable polymer layer 51. Polymer 51 in the illuminated regions of photoablatable polymer layer is selectively removed by laser ablation. Drawing element 54 in these Figures shows ablated regions of polymer layer 51 which expose selected regions of substrate 50. As shown in FIG. 3, this processing step generates a laser ablation patterned photoablatable polymer layer 51 capable of functioning as a deposition mask.

For ablation of the photoablatable polymer layer, various kinds of laser can be used. The wavelength of the laser is preferably selected considering the composition and absorption spectrum of polymers comprising the photoablatable polymer layer 51. Each polymer, which could be ablated by laser, has different absorption characteristics when illuminated by laser. For example, polymethylmethacrylate can be ablated easily by lasers of 193 nm, 240 nm, 248 nm wavelengths. The polybenzimidazole is easily ablated by lasers of 266 nm wavelength. The selection of the laser, therefore, is dependent on the kind of polymer that would be ablated.

Figure 4:
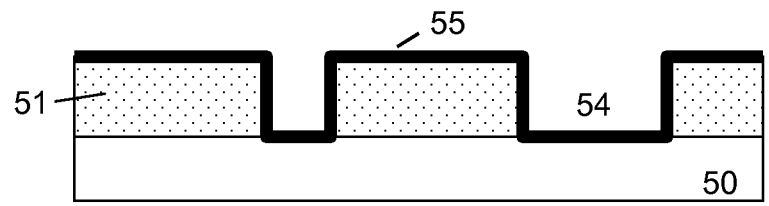
FIG. 4 provides a schematic diagram showing the layer of material 55 deposited to laser ablation patterned PR layer 51 and substrate 50.

Step 3 corresponds to material deposition processing steps of the method. In this process, a thin film of an appropriate material 55 is deposited on the laser ablation patterned photoablatable polymer layer 51 and on regions of the substrate that are exposed by ablated regions 54. Material deposition methods useful in this processing step include, but are not limited to, chemical vapor deposition, physical vapor deposition, sol-gel coating method or equivalents known in the art. During the deposition process, material is deposited on the whole, or a portion of the substrate 50 area provided with the laser ablation patterned photoablatable polymer layer 51. At the regions where the photoablatable polymer is ablated 54, the deposition material is deposited directly on exposed regions of the substrate 50. At the regions where the photoablatable polymer is not ablated 51, the material is deposited on the laser ablation patterned photoablatable polymer layer 51. In some embodiments, the deposition temperature in this process is lower enough so that the photoablatable polymer layer 51 is not be damaged, degraded or deformed by temperature increases occurring during deposition processing. Use of a deposition temperature below the baking temperature of the photoablatable polymer is preferable for some methods. FIG. 4 provides a schematic diagram showing a thin film of material 55 deposited to laser ablation patterned photoablatable polymer layer 51 and substrate 50.

Figure 5:
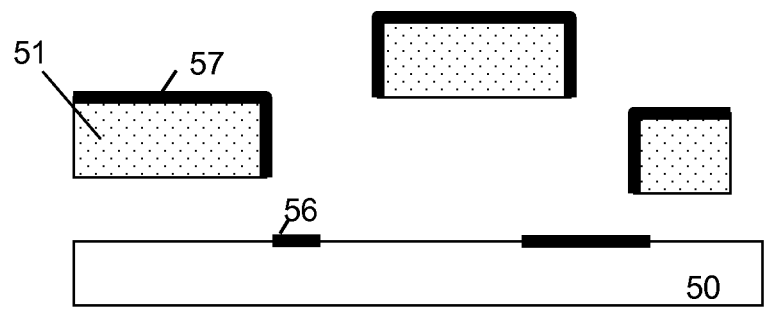
FIG. 5 provides a schematic diagram shown removal of laser ablation patterned PR layer 51 which lifts of deposited material 57 provided on external surface of layer 51.

Step 4 corresponds to lift-off processing. This process removes the photoablatable polymer layer 51 resulting in lift off of deposited material 57 provided on the surface of the layer 51. FIG. 5 provides a schematic diagram shown removal of laser ablation patterned photoablatable polymer layer 51 which lifts of deposited material 57 provided on external surface of layer 51. As shown in this figure, however, deposited material 56 provided on the substrate 50 is not removed in the lift-off process. Accordingly, lift-off processing in the present invention is selective for deposited material 57 provided on the laser ablation patterned photoablatable polymer layer 51. The present invention includes three methods of lift-off processing: (i) conventional wet chemical lift-off (e.g., dissolution and/or stripping processing), (ii) laser ablation lift-off processing and (iii) a hybrid method combining laser ablation lift-off processing and conventional wet chemical lift-off (e.g., dissolution and/or stripping processing).

In wet chemical lift-off (e.g., dissolution and/or stripping processing) lift-off processing, PR stripper, or other suitable chemical (e.g., solvent), is used for the lift-off process. In some embodiments, for example, the substrate is dipped in PR stripper or other suitable chemical (e.g. solvent), thereby causing the photoablatable polymer layer 51 to be dissolved and removed from substrate 50. As a lift-off process, the material on the photoablatable polymer 57 provided on photoablatable polymer 51 is also effectively removed during this processing step. This lift-off process is selective, however, and therefore, leaves deposited material 56 patterned on the substrate 50. The kind of chemical (e.g., solvent, stripper etc.) in the lift-off process is selected depending on the type of polymer to be removed.

Figure 6:
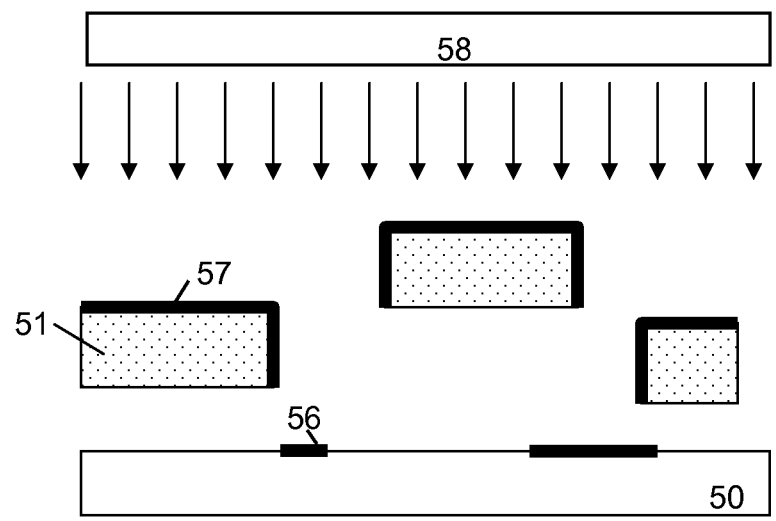
FIG. 6 provides a schematic diagram illustrating exposure of the laser ablation patterned layer 51 with electromagnetic radiation 58 having a radiation energies and wavelengths capable of initiating photoablation in layer 51 so as to cause selective removal of deposited material 57 provided on the external surfaces of layer 51.

In laser ablation lift-off processing, the photoablatable polymer 51 is ablated by laser through deposited material 57 provided on the layer 51. FIG. 6 provides a schematic diagram illustrating exposure of the laser ablation patterned layer 51 with electromagnetic radiation 58 having radiant energies and wavelengths capable of initiating photoablation in layer 51 so as to cause selective removal of deposited material 57 provided on the external surfaces of layer 51. In this method, laser 58 illumination (schematically shown as arrows in FIG. 6) of the whole surface of laser ablation patterned photoablatable polymer layer 51, for example without an optical mask, can be used. If the deposited material is optically transparent to the laser ablation wavelengths used in this process, for example by using an ITO deposited layer; the underlying photoablatable polymer 51 can be effectively ablated, by illumination with electromagnetic radiation from laser 58. This lift-off process is selective, however, and therefore, leaves deposited material 56 patterned on the substrate 50.

Figure 7A:
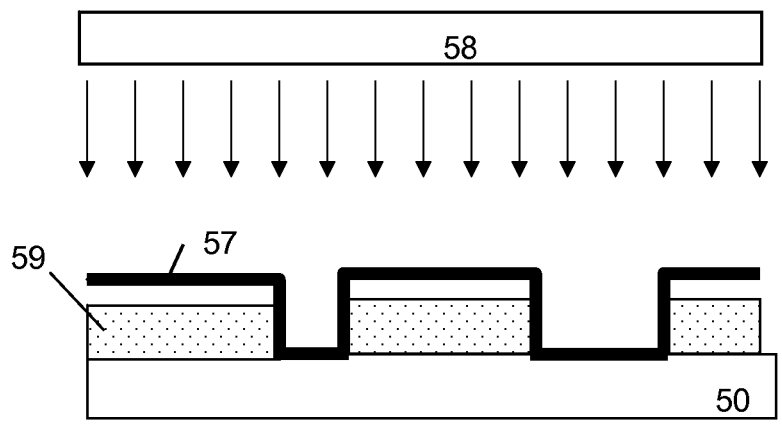
FIGS. 7a and 7b provide schematic diagrams illustrating the hybrid lift-off method combining laser ablation lift-off processing and conventional dissolution/stripping lift-off processing.
Figure 7B:
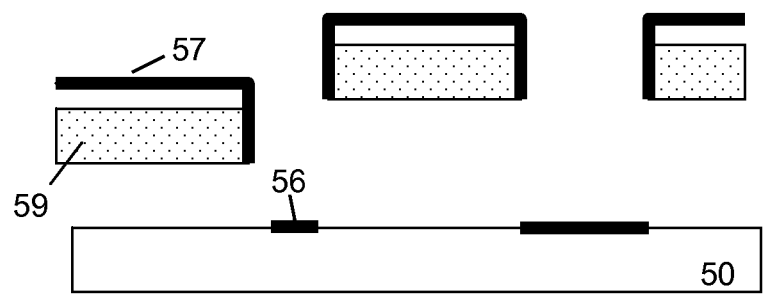

In the hybrid method, a combination of laser ablation processing and wet chemical processing are used to achieve selective lift-off. FIGS. 7a and 7b provide schematic diagrams illustrating the hybrid lift-off method combining laser ablation lift-off processing and conventional wet etching lift-off processing. Given the laser ablation component of this processing method, use of deposited material 55 that is optically transparent to laser ablation electromagnetic radiation is preferred to allow effective and efficient ablation of the pattern photoablatable polymer layer 51. As shown in FIG. 7a, laser ablation electromagnetic radiation (schematically shown as arrows in FIG. 7a) is provided to photoablatable polymer layer 51. The upper portion of the photoablatable polymer 51 is ablated by laser through transparent deposited material 57 leaving a remaining portion of the photoablatable polymer layer 59. This ablation step optionally provides direct lift-off of deposited material 57. As shown in FIG. 7b, the remaining portion of the photoablatable polymer layer 59 is removed in this method by wet chemical processing, for example chemical stripping. Partial removal of the polymer by laser ablation in the hybrid method provides several advantages in the present invention. First, as only a thin layer of the polymer is ablated, the number of ablation pulses required from the laser 58 is less, which improves the throughput and also increases the life time of the optics as they are exposed to fewer pulses from the laser per substrate. Also, as the ablation laser beam does not ablate through to the full depth of the polymer, the underlying TFT are protected from the high energy UV radiation. This aspect is important in applications involving fabrication of thin film transistor devices, as some of the transistor electronic characteristics can be changed under influence of the UV beam.

As an example of the hybrid method, the present invention includes lift-off of a deposited ITO film using XeF excimer laser electromagnetic radiation at 351 nm. In this example of the invention, photoablation is used to provide lift-off, as ITO is optically transparent at a wavelength of 351 nm. Further, many polymers (e.g. PR materials) are capable of ablation at this wavelength. The substrate having the laser ablation patterned PR layer is flood exposed (without an optical mask) using the 351 nm excimer laser. In these embodiments, the XeF excimer laser parameters are optimized to precisely remove just the top layer of the polymer, approximately 0.1~0.3 um, which is sufficient to lift-off the ITO from the substrate. The substrate can then be immersed in an appropriate stripper solution to remove the rest of the polymer (e.g., PR) layer.

Figure 8:
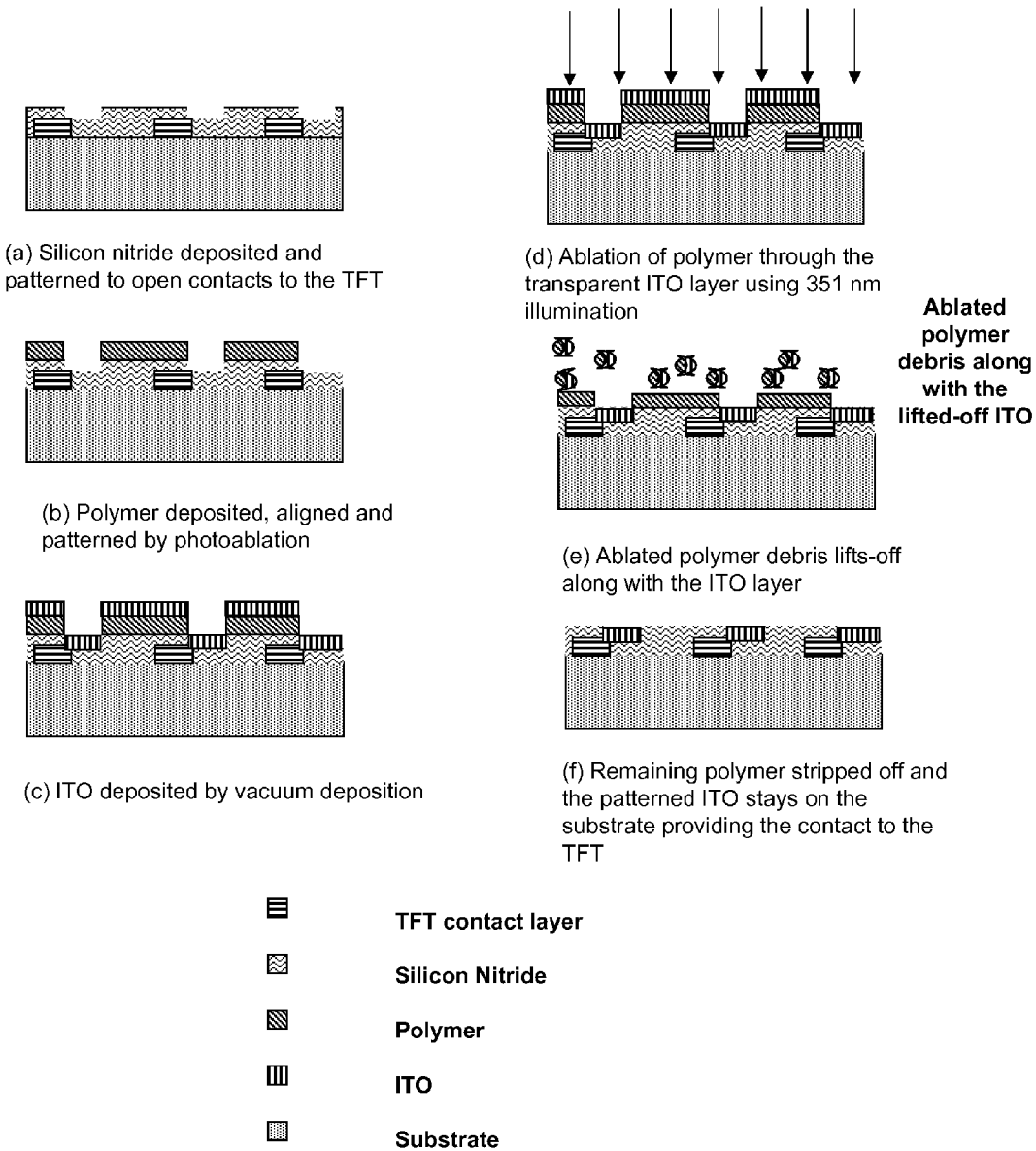
FIG. 8 provides a schematic diagram illustrating a method of patterning ITO layers using a photoablation based lift-off technique of the present invention.

FIG. 8 provides a schematic diagram illustrating a method of patterning ITO layers using a photoablation based lift-off technique of the present invention useful for fabricating flat panel display devices. As illustrated in Panel (a) of FIG. 8, silicon nitride is deposited on a substrate and patterned to open contacts to a thin film transistor. As illustrated in Panel (b) of FIG. 8, polymer is deposited on the silicon nitride passivation layer. The polymer layer is subsequently patterned via laser ablation patterning. As illustrated in Panel (c) of FIG. 8, next an ITO thin film is deposited via vacuum deposition. In this processing steps, ITO is deposited in the patterned regions that forms the contact with the thin film transistors on the substrate as well as on the remaining portion of the laser ablation patterned polymer layer. As illustrated in Panel (d) of FIG. 8, the laser ablation patterned polymer layer is exposed to electromagnetic radiation transmitted by the transparent ITO thin film. In the embodiment shown in FIG. 8, ablation is achieved using XeF excimer laser electromagnetic radiation at 351 nm. As illustrated in Panel (e) of FIG. 8, ablated polymer debris lift-off along with a portion of ITO layer that is provided on the laser ablation patterned polymer layer. As shown in Panel (f) of FIG. 8, the ITO provided to the substrate remains, however, providing the contacts to the thin film transistors on the substrate There are substantial differences between the present patterning approach and conventional laser ablation technology. In the present methods, deposition material is patterned corresponding to the regions where laser electromagnetic radiation is provided during processing. In contrast, material is removed regions where laser electromagnetic radiation is provided during processing in conventional ablation technology. This characteristic is very important in patterning applications for TFT-LCD fabrication. Use of conventional laser ablation patterning of ITO, as is explained above, can deleteriously affect the underlying TFT device components due to illumination of laser energy. In the present method, however, the underlying TFT device components are not exposed to significant energies of laser electromagnetic radiation during processing, and therefore are not expect to result in a change in their characteristics.

Another merit of this new method is the availability of materials useful for implementation. In conventional direct laser ablation patterning, the patterned materials are significantly limited because many materials are not easily ablated by conventional lasers. However, in the present invention, this limitation on deposited material is eliminated. Any material that can be deposited on the laser ablation patterned polymer layer and that can be removed by wet chemical, laser ablation and hybrid lift off methods described above can be used in the present method. For example, aluminum is not easily ablated in conventional laser ablation process because it does not absorb significantly enough radiant energy from laser illumination. In the present invention, however, aluminum can be deposited on the laser ablation patterned polymer layer and the final structure can be fabricated after lift-off processing.

Another merit of the present invention is the availability of laser ablation sources compatible with the present methods. There are limited kinds of materials that can be ablated by lasers. Selection of the material to be ablated influences laser ablation source selection. Accordingly, material selection and laser selection must be considered to match each other for conventional direct ablation patterning. However, in the present invention, there are wide range of available polymers that can be ablated by a range of laser ablation sources. Accordingly, the present invention provides more flexibility as to the selection of a laser ablation source.

Another merit of the present method is ability of provide high resolution patterning of fine features. In conventional laser ablation methods, some materials do not exhibit good linearity upon direct laser ablation patterning. For these materials, the edge of the pattern can be curved or rough after laser ablation. Therefore, conventional laser ablation is susceptible to problems with fine unwanted patterns for some hard to ablate materials. In the present methods, however, the final pattern after lift-off exhibits good linearity compared with conventional direct ablation methods, even for hard to ablate materials. The state of the art of polymer ablation is very good, and sufficient for the requirements of a wide range of microelectronic fabrication applications. Using the present invention, the minimum feature size can be reduced below sub-micron physical dimensions with good linearity of pattern. If the deposition on the polymer is conformal, the final pattern after lift-off is very clean. The minimum feature size provided by the present methods can be reduced to the sub-micron range.

Another merit of the present methods is the price of patterning system. The price of laser ablation systems is significantly less than that of conventional photolithography systems. By the invented method, the initial investment could be reduced. Also, the maintenance cost could be reduced because laser ablation system is much simple than conventional photolithography systems.

Another merit of this system is its high throughput. Laser ablation systems have a smaller number of components compared with conventional photolithography systems. Because the processing speed of laser ablation system is similar to that of photolithography method, the entire process time is reduced.

Another merit of this method is the cost of production. This invented method does not need developer and etchant compared with conventional photolithography and etch process. So production cost associated with chemicals and disposing chemicals will be decreased.

Another merit of this method is its use of low fluence radiation. In case of conventional direct ablation, the fluence energy is a few $J/cm^2$, but this large amount of illumination can make unwanted damage to underlying structure. However, this invention uses low fluence illumination, 10s of $mJ/cm^2$ to hundreds of $mJ/cm^2$, so that the chance of damage to underlying structure is significantly decreased.

There are essentially no restrictions on the size of the patterns for this fabrication method. This invention can be applied from sub-micron size patterns to hundreds of micron size patterns. The thickness of the material is not restricted, either. The thickness of the materials can be varied from tenth of angstroms to tenth of micrometers.

EXAMPLE 1

ITO Thin Film Patterning for The Fabrication Of Thin Film Transistor-Liquid Crystal Display Systems It is a goal of the present invention to provide a high throughput and low cost patterning platform for making large area microelectronic display devices. The present example provides processing steps and materials strategies for making an important class of flat panel display devices comprising thin film transistor—liquid crystal display systems.
1.a. Basic Principle of Flat Panel Display Devices The images in flat panel displays (FPD) are composed of millions or more, colored dots controlled by outer devices. These dots are called pixels and each pixel is the basic unit for image generation. The pixels in the FPD emit controlled-colored-light to the designated directions. A pixel can make various colors by generating light by itself, or by controlling the amount of light that is generated by the attached light source. For generating images in FPD, each pixel should be controlled by an outer signal.

Figure 9:
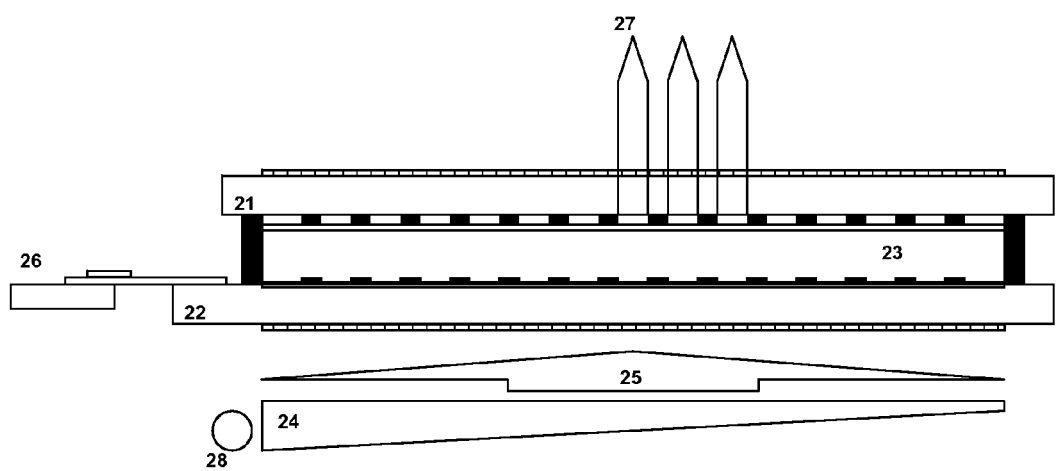
FIG. 9 provides a cross sectional view of TFT-LCD panel.

FIG. 9 provides a cross sectional view of TFT-LCD panel. As shown in FIG. 9, the light is generated by back light 28, and diffuses uniformly in the light guide module 24. The uniform light 25 generated by back light go through TFT substrate 22, liquid crystal 23, color filter substrate 21, and then makes desired image 27. The amount of light going through each pixel in TFT-LCD module (21, 22 and 23) is controlled by outer voltage signal from gate and data driver 26. In order to control the voltage of pixel, each pixel has one or more of their own transistor. The transistor receives signal from driver 26 and controls the voltage level of each pixel. In the PDP, each pixel is driven by controlling the applied voltage. Different voltage makes different plasma generation, which results in different color generation. Therefore, millions of, or more, microstructures should be fabricated in one display panel. The microelectronic fabrication technologies are used for this purpose.
1.b. Conventional Display Device Fabrication The TFT-LCD panel is fabricated by assembling TFT substrate 22 and color filter substrate 21, as shown in FIG. 9. Between the two substrates, liquid crystal 23 is injected and driven by the voltage from TFT substrate. For the fabrication of these two substrates, microelectronic process such as deposition, photolithography, etching and other processes like semiconductor chip fabrication. Especially, millions of TFTs are fabricated on the TFT substrate 22 by microelectronic process. FIGS. 10-14 provide schematic diagrams illustrating conventional microelectronic fabrication process for making TFTs for display devices.

Figure 10:
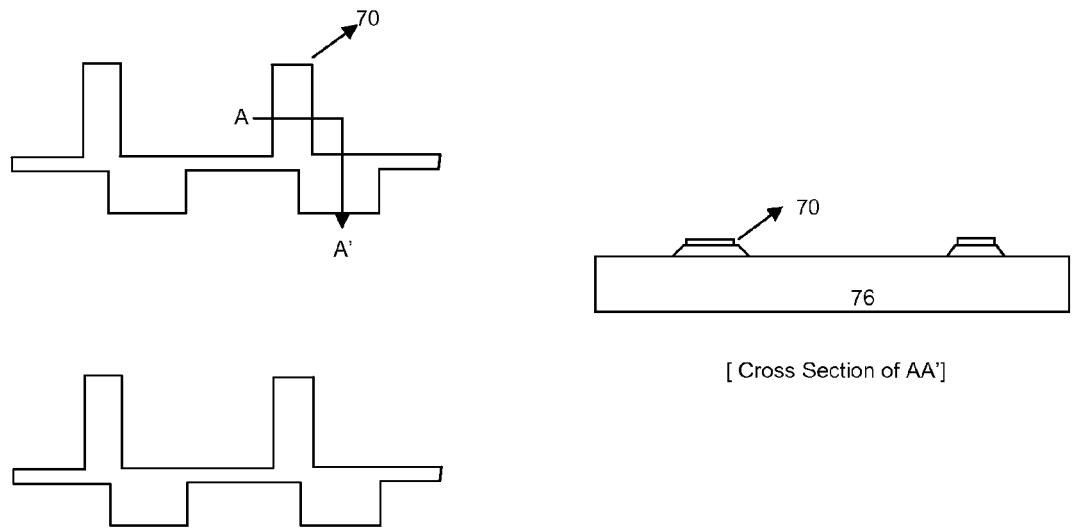
FIG. 10 provides a schematic diagram illustrating the lay out of TFT gate electrodes on a glass display device substrate.

FIG. 10 provides a schematic diagram illustrating the layout of TFT gate electrodes on a glass display device substrate. As shown in the Figure, the gate metal 70, usually Mo/Al—Nd, is deposited on the glass substrate 76. Gate metal is then patterned by photolithography and wet etch methods.

Figure 11:
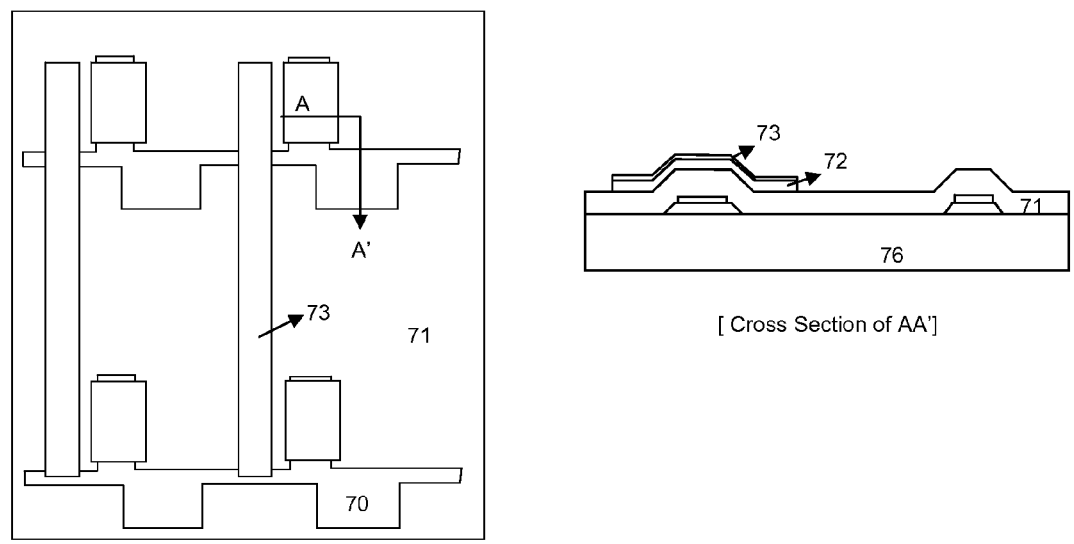
FIG. 11 shows the active deposition and patterning processes for making TFT structures on display device substrates.

FIG. 11 shows the active deposition and patterning processes for making TFT structures on display device substrates. The silicon nitride 71, amorphous silicon 72 and phosphor doped amorphous silicon 73 are deposited layer by layer. After photolithography and etch process, the amorphous silicon 72 and phosphor doped amorphous silicon 73 are patterned as is shown in the FIG. 11.

Figure 12:
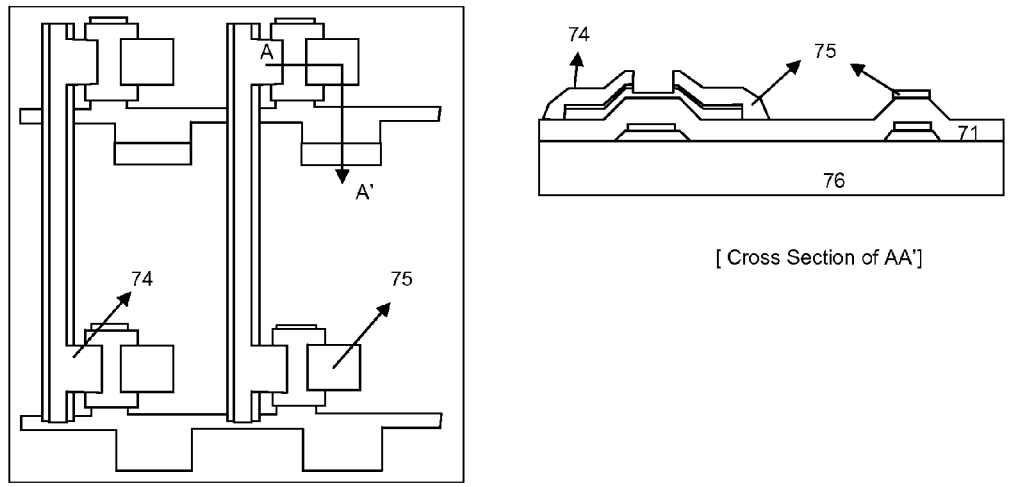
FIG. 12 provides a schematic diagram illustrating the layout of source and drain electrodes of TFT structures on display device substrates.

FIG. 12 provides a schematic diagram illustrating the layout of source and drain electrodes of TFT structures on display device substrates. As a source and drain layer, metal layer used both as source 74 and drain 75 is deposited and patterned, as shown in FIG. 12. Molybdenum, Chromium, Molybdenum/Aluminum/Molybdenum, Aluminum alloy, Copper/metallic layer or Copper alloy is used for this layer. Photolithography followed by wet etch or dry etch process is used for patterning the source and drain layer.

Figure 13:
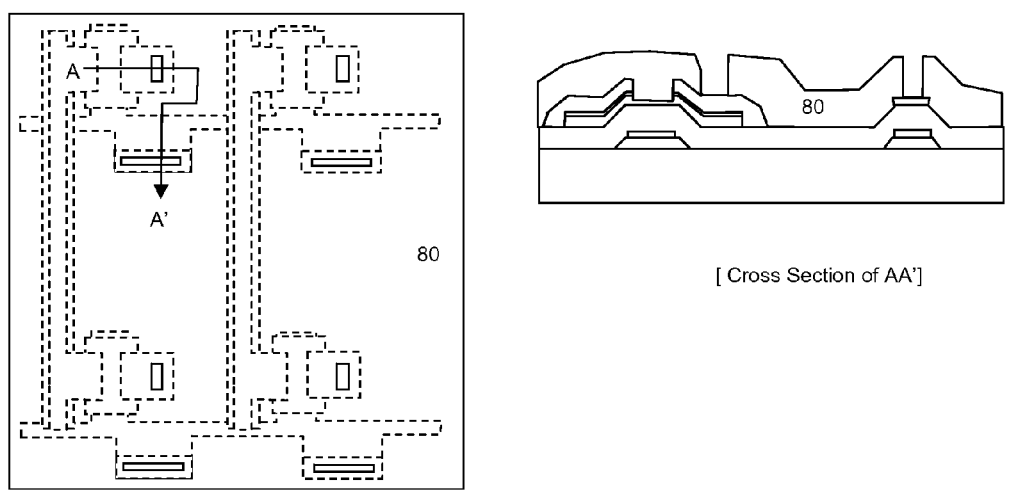
FIG. 13 provides a schematic diagram illustrating the passivation layer for TFT structures on display device substrates.

FIG. 13 provides a schematic diagram illustrating the passivation layer for TFT structures on display device substrates. Following the source and drain patterning process, passivation layer 80 is deposited and patterned, as shown in FIG. 13. For the passivation layer, material such as silicon nitride, silicon oxide, silicon oxynitride or polymer layer is used to protect the TFT from outside contamination and damage.

Figure 14:
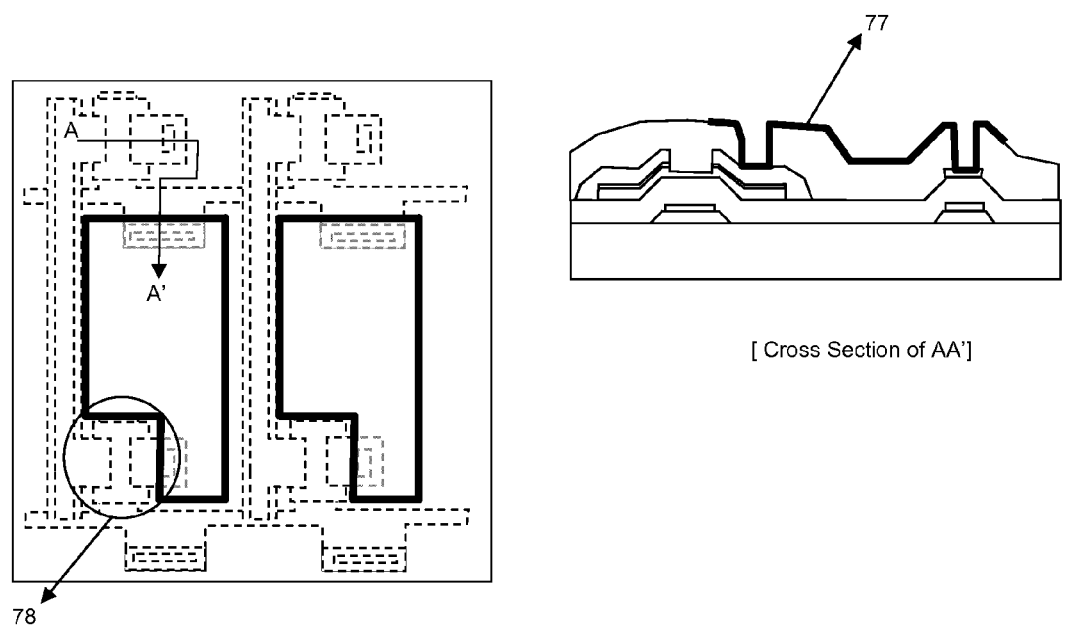
FIG. 14 provides a schematic diagram illustrating the patterned transparent conductive layer for TFT structures on display device substrates FIG. 15 provides a schematic diagram providing a top plan view of TFT structures in TFT-LCD panels.

FIG. 14 provides a schematic diagram illustrating the patterned transparent conductive layer for TFT structures on display device substrates. Following the passivation layer process, transparent conductive layer 77 is deposited and patterned as shown in FIG. 14. Indium Tin Oxide (ITO) is commonly used as a transparent conductive layer because it has high transparency (>95%) and good electrical conductivity (~200 μOhm·cm). For the patterning of ITO, a photolithography and wet etch process is commonly used in commercial settings. For the direct patterning of ITO, excimer laser ablation is researched now, but it is not used in mass production yet due to significant problems in fabrication process.

The fabrication process for TFT substrate 22 is finished after patterning the transparent conductive layer 77. After the fabrication process of color filter substrate 21, assembly process and some following process, the fabrication of TFT-LCD module is finished. Other display devices such as PDP or OLED are fabricated by using similar processes. The design of the panel and layer sequences, however, is typically different.

In conventional microelectronic fabrication processing used for fabricating display products, the photolithography process is one of the most time consuming and high cost process. A conventional photolithography system has two kinds of problems to be solved: cost and time. The price of photolithography systems is typically very high in display industry. Large size optical components and mechanical alignment parts at typically required when large area device substrates are used. The price of such photolithography optical systems increases rapidly as the size of optical components are increased, which makes it hard to install more photolithography systems in the fabrication plant for the purposed of increasing the output.

Also, photolithography systems consist of many kinds of sub-equipment such as a PR coating system, a soft bake system, a photolithography system, a develop system and a hard bake system. The complexity of the photolithography system requires a large footprint in plant, high cost for fabrication, large maintenance chances and longer process time for fabrication.

1.c. Ablation in Display Technology

As described above, direct laser ablation has been suggested for ITO patterning or organic material patterning to reduce the fabrication cost and time. There are significant known problems, however, in the ablation of an ITO thin film by laser ablation.

First, there is significant potential that ITO debris will be generated upon laser ablation. This ITO debris can cause electrical short between patterned ITO structures. If there is any electrical shortage between two ITO pixels or more, for example, there could be a point or line defect in the display images.

Second, the characteristics of the transistor could be changed due to exposure to high radiant energies of laser electromagnetic radiation during direct ablation processing. As shown in FIG. 14, the ITO above the TFT 78 should be removed to get high quality images on displays. But when the ITO above TFT is ablated by laser illumination, the active layer of TFT can absorb the energy from the laser illumination. The characteristics of active layers such as amorphous Si (a-Si) can be changed, which may result in a change in characteristics of TFT. The changed characteristics of TFT can result in problems in generating the desired image while it is driven.

Also, the pattern linearity after direct laser ablation patterning of ITO is not good. If the linearity of ITO is not good, it can not be used for high resolution display device application. For example, In-Plane-Switch (IPS) mode in TFT-LCD requires minimum feature size of 3 um or more fine. In this case, ITO ablation by direct laser ablation can not be used because final pattern shape fails to meet the desired specifications of panel design.

1.d. Fabrication of ITO Pattern in TFT-LCD Panel

In view of the problems with convention patterning technologies descried above, new fabrication techniques are clearly needed, particularly for patterning ITO thin film layers in display device fabrication applications. The new technology should meet the following requirements: the fabrication cost should be low, the throughput should be high, the pattern resolution should be high, and the techniques should be compatible with processing large substrate areas substrate.

Figure 15:
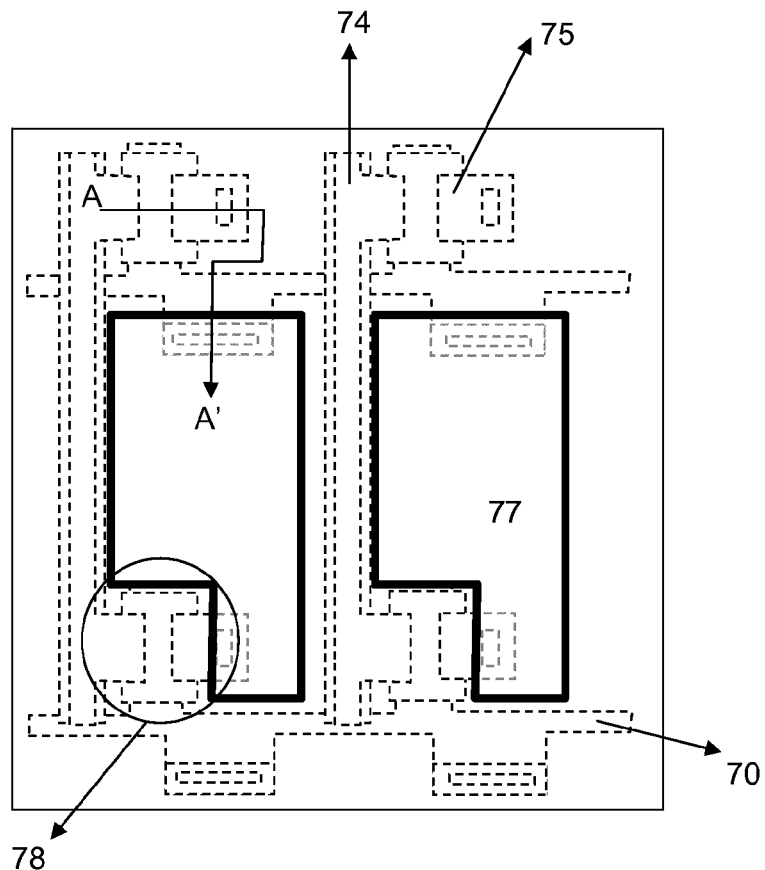
Figure 16:
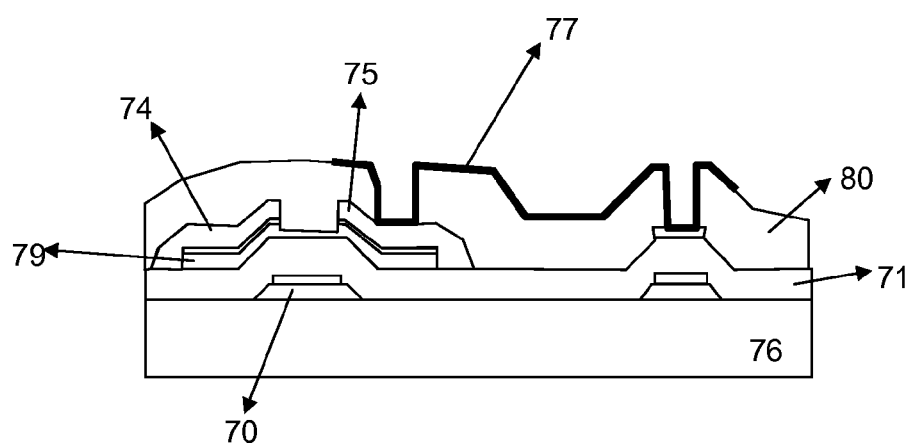
FIG. 16 provides a schematic diagram providing a cross sectional view of A" identified in FIG. 15, showing TFT and capacitor structure.

In the present methods, ITO is commonly used as a transparent conductive layer in TFT-LCD panel. FIG. 15 provides a schematic diagram providing a top plan view of TFT structures in TFT-LCD panels. FIG. 16 provides a schematic diagram providing a cross sectional view of A" identified in FIG. 15, showing the TFT and capacitor structure. Depending on the driving mode of liquid crystal, the structure of TFT can be changed, but there must be active devices, such as transistor 78 in FIG. 15, to drive the liquid crystal. The transistor is consisted of gate metal 70, active layer 79 (a-Si and phosphor doped a-Si), source 74 and drain metal 75, passivation layer 76 and pixel layer 77. In conventional methods, the thickness of gate metal 70 is 100~1000 nm, thickness of gate insulator 71 is 50~1000 nm, thickness of active layer 79 is 50~500 nm, thickness of passivation layer 80 is 100~1000 nm, and thickness of transparent conductive layer 77 is 10~500 nm.

In the fabrication of TFT panels, the last step is patterning of transparent conducting layer 77, usually ITO or doped ZnO, by conventional photolithography process. ITO can be ablated by direct laser ablation to reduce the investment cost and reduce the fabrication cost. However, the TFT area 78 shown in FIG. 15 will be exposed to laser electromagnetic radiation in conventional direct laser ablation process upon patterned removal of selected regions of the ITO thin film. This is problematic, as discussed above, because the electronic characteristics of the underlying TFT can be changed by absorption of laser energy during direct laser ablation pattern, which may result in a serious problems in image driving of the final product. Also, the edge quality of direct laser ablation patterned ITO 77 may not be very good due to the ablation properties of the ITO thin film.

The present invention solves these ITO patterning problems. In the present methods, patterned laser ablation is used to pattern a photoablatable polymer layer provided to the substrate surface. This laser ablation patterned layer functions as a deposition mask to provide patterning of ITO to selected regions of the substrate, for example, the gates electrodes of the TFT device components. The laser ablation patterned layer also serves as a sacrificial layer after ITO deposition providing selective material lift off of ITO thin film provided on the patterned mask layer. Accordingly, only the area where ITO is deposited will be exposed to laser electromagnetic radiation during patterned laser ablation processing. In conventional TFT-LCD structures, there is no electrical structure underneath the patterned ITO areas, therefore, this exposure is not likely to result in problems relating to degradation of the underlying thin film transistor device components. Accordingly, no change in TFT electronic characteristics is expected in the present patterning methods.

EXAMPLE 2

Fabrication of AlNd Pattern in TFT-LCD Panel

As is shown in FIG. 16, the gate metal 70 is deposited on the glass substrate 76 to fabricate TFT structures. AlNd (Nd<5%) is commonly used material for this purpose. The conventional patterning method for AlNd is photolithography and wet etching method. The laser ablation of AlNd is known to be very hard due to material characteristics. However, the present invention can be applied to patterning of AlNd layer to achieve cost effective and high resolution patterning. In these methods, patterned laser ablation of a deposited polymer is used to generate a deposition mask, similar to the processing described in the context of ITO patterning. The present methods do not require direct laser ablation patterning of AlNd. As will be apparent to one of ordinary skill in the art, other materials can be patterned by the present methods, thereby eliminating the need for conventional photolithography and etching processing steps.

Statements Regarding Incorporation by Reference and Variations

All references throughout this application, for example patent documents including issued or granted patents or equivalents; patent application publications; unpublished patent applications; and non-patent literature documents or other source material; are hereby incorporated by reference herein in their entireties, as though individually incorporated by reference, to the extent each reference is at least partially not inconsistent with the disclosure in this application (for example, a reference that is partially inconsistent is incorporated by reference except for the partially inconsistent portion of the reference).

Any appendix or appendices hereto are incorporated by reference as part of the specification and/or drawings.

Where the terms "comprise", "comprises", "comprised", or "comprising" are used herein, they are to be interpreted as specifying the presence of the stated features, integers, steps, or components referred to, but not to preclude the presence or addition of one or more other feature, integer, step, component, or group thereof. Separate embodiments of the invention are also intended to be encompassed wherein the terms "comprising" or "comprise(s)" or "comprised" are optionally replaced with the terms, analogous in grammar, e.g.; "consisting/consist(s)" or "consisting essentially of/consist(s) essentially of" to thereby describe further embodiments that are not necessarily coextensive.

The invention has been described with reference to various specific and preferred embodiments and techniques. However, it should be understood that many variations and modifications may be made while remaining within the spirit and scope of the invention. It will be apparent to one of ordinary skill in the art that compositions, methods, devices, device elements, materials, procedures and techniques other than those specifically described herein can be applied to the practice of the invention as broadly disclosed herein without resort to undue experimentation. All art-known functional equivalents of compositions, methods, devices, device elements, materials, procedures and techniques described herein are intended to be encompassed by this invention. Whenever a range is disclosed, all subranges and individual values are intended to be encompassed as if separately set forth. This invention is not to be limited by the embodiments disclosed, including any shown in the drawings or exemplified in the specification, which are given by way of example or illustration and not of limitation. The scope of the invention shall be limited only by the claims.

We claim:

1. A method for generating a pattern of structures of a conductive material on a substrate, said method comprising the steps of:
   i. providing a sacrificial layer of photoablatable material on at least a portion of said substrate, wherein said sacrificial layer of photoablatable material is a photoablatable polymer;
   ii. removing photoablatable material from selected regions of said sacrificial layer of photoablatable material via patterned laser ablation; thereby generating a deposition mask having a pattern of recessed features providing exposed regions of said substrate and masked regions of said substrate masked by said sacrificial layer of photoablatable material;
   iii. depositing said conductive material on said deposition mask and onto at least a portion of said exposed regions of said substrate; wherein said conductive material is an optically transparent metal, alloy or metal oxide, and
   iv. exposing said sacrificial layer of photoablatable material to electromagnetic radiation transmitted through said optically transparent metal, alloy or metal oxide that provides for at least partial laser ablation of said sacrificial layer of photoablatable material, wherein at least partial laser ablation of said sacrificial layer of photoablatable material selectively lifts off said conductive material provided on said sacrificial layer of photoablatable material and does not remove at least a portion of said conductive material provided on said exposed regions of said substrate, thereby generating said pattern of structures of said conductive material on said substrate.

2. The method of claim 1 wherein said substrate is prepatterned with one or more electronic device components supported by said substrate.

3. The method of claim 2 wherein at least a portion of said structures of said pattern is positioned such that they are spatially aligned, in electrical contact or both with at least one of said electronic device components supported by said substrate.

4. The method of claim 1 wherein said sacrificial layer of photoablatable material is provided in conformal contact with a surface of said substrate undergoing processing.

5. The method of claim 1 wherein said patterned laser ablation of said selected regions of said sacrificial layer of photoablatable material generates said pattern of recessed features extending entirely through said sacrificial layer of photoablatable material, thereby exposing said exposed regions of said substrate.

6. The method of claim 5 wherein said step of depositing said conductive material comprises depositing at least one thin film of said conductive material.

7. The method of claim 6 wherein said thin film is deposited onto said sacrificial layer of photoablatable material having said recessed features and onto said exposed regions of said substrate.

8. The method of claim 5 wherein said step of removing said sacrificial layer of photoablatable material further comprises the step of dissolving a portion of said sacrificial layer of photoablatable material after said partial ablation of said sacrificial layer of photoablatable material.

9. The method of claim 1 wherein said sacrificial layer of photoablatable material is a photoresist.

10. The method of claim 1 wherein said sacrificial layer of photoablatable material is selected from the group consisting of polymethylmethacrylate, polyimide, polyethylene terephathalate, polystyrene, polycarbonate, polybenzimidazole, tetrafluoroethylene, polyester, cellulose acetate and polymethyl isopropenyl ketone (PMIPK).

11. The method of claim 1 wherein said sacrificial layer of photoablatable material is provided in physical contact with said substrate.

12. The method of claim 1 further comprising the step of stabilizing said sacrificial layer of photoablatable material provided on said substrate.

13. The method of claim 1 wherein said step of removing photoablatable material from said selected regions of said sacrificial layer of photoablatable material via laser ablation comprises the steps of:
provide a laser for generating laser electromagnetic radiation;
providing an optical mask positioned between said laser and said sacrificial layer of photoablatable material, wherein said optical mask comprises a pattern of transmissive regions and non-transmissive regions; and
illuminating said optical mask with said laser electromagnetic radiation, wherein a transmitted portion of said electromagnetic radiation is transmitted by said transmissive regions of said optical mask and is provided to said sacrificial layer of photoablatable material.

14. The method of claim 13 wherein transmission of said laser electromagnetic radiation by said optical mask generates a selected non-uniform spatial distribution of radiant intensities of electromagnetic radiation provided to said sacrificial layer of photoablatable material capable of generating a selected pattern of exposed regions of said substrate.

15. The method of claim 1 wherein said step of depositing said conductive material on at least a portion of said exposed regions of said substrate is carried out at a temperature low enough to avoid degradation of the sacrificial layer of photoablatable material.

16. The method of claim 1 wherein said conductive material is selected from the group consisting of aluminum, copper, chromium, nickel, titanium, tungsten, gold, tin, zinc, indium oxide, indium tin oxide, zinc oxide, tin oxide and carbon film.

17. The method of claim 1 wherein the step of depositing said conductive material provides at least one thin film of said conductive material to said exposed regions of said substrate and to said sacrificial layer of photoablatable material, wherein ablation of said sacrificial layer of photoablatable material lifts off conductive material provided on said sacrificial layer of photoablatable material and does not remove at least a portion of said thin film of said conductive material provided on said exposed regions of said substrate.

18. The method of claim 1 wherein said sacrificial layer of photoablatable material is exposed to a radiant energy of said electromagnetic radiation transmitted by said optically transparent metal, alloy or metal oxide sufficient to remove an ablated portion of said sacrificial layer of photoablatable material, wherein said ablated portion does not extend the entire thickness of said sacrificial layer of photoablatable material.

19. The method of claim 18 wherein said ablated portion extends from a surface of said sacrificial layer of photoablatable material in contact with said thin film of said conductive material a distance into said sacrificial layer of photoablatable material greater than or equal to 100 nanometers.

20. The method of claim 18 wherein said ablated portion of said sacrificial layer of photoablatable material extends between about 10% and about 50% of the entire thickness of said sacrificial layer of photoablatable material.

21. The method of claim 18 further comprising the step of contacting said sacrificial layer of photoablatable material having an ablated portion with solvent capable of dissolving said sacrificial layer of photoablatable material.

22. The method of claim 1 wherein said substrate is a device substrate prepatterned with thin film components of a thin film transistor display device.

23. The method of claim 22 wherein said thin film transistor display device is a thin film transistor—liquid crystal display device, an organic light emitting display device or a plasma display panel device.

24. The method of claim 1 wherein said substrate is a device substrate prepatterned with components of an integrated electronic circuit.

25. The method of claim 1 comprising a method of making a device selected from the group consisting of a thin film transistor—liquid crystal display device, an organic light emitting display device, a plasma display panel device, an integrated electronic circuit, a sensor, a sensor array, a microfluidic system, a nanofluidic system, a nanoelectromechanical system and a microelectromechanical system.

26. A method for generating a pattern of structures of a conductive material on a substrate, said method comprising the steps of:
i. providing a sacrificial layer of photoablatable material on at least a portion of said substrate, wherein said sacrificial layer of photoablatable material is a photoablatable polymer;
ii. removing photoablatable material from selected regions of said sacrificial layer of photoablatable material via laser ablation; thereby generating a deposition mask having a pattern of recessed features providing exposed regions of said substrate and regions of said substrate masked by said sacrificial layer of photoablatable material;
iii. depositing a thin film of said conductive material on said deposition mask and onto at least a portion of said exposed regions of said substrate, wherein said conductive material is a an optically transparent metal, alloy or metal oxide; and
iv. exposing said sacrificial layer of photoablatable material to a radiant energy of electromagnetic radiation transmitted through said optically transparent metal, alloy or metal oxide sufficient to initiate at least partial laser ablation of at least a portion of said sacrificial layer of photoablatable material, wherein at least partial laser ablation of said sacrificial layer of photoablatable material lifts off said conductive material deposited on said sacrificial layer of photoablatable material and does not remove at least a portion of said thin film of said conductive material deposited on said exposed regions of said substrate, thereby generating said pattern of structures of said conductive material on said substrate.

27. A method for generating a pattern of structures of a conductive material on a substrate, said method comprising the steps of:
i. providing a sacrificial layer of photoablatable material on at least a portion of said substrate, wherein said sacrificial layer of photoablatable material is a photoablatable polymer;
ii. removing photoablatable material from selected regions of said sacrificial layer of photoablatable material via laser ablation; thereby generating a deposition mask having a pattern of recessed features providing exposed regions of said substrate and regions of said substrate masked by said sacrificial layer of photoablatable material;
iii. depositing a thin film of said conductive material on said deposition mask and onto at least a portion of said exposed regions of said substrate, wherein said conductive material is a an optically transparent metal, alloy or metal oxide; and
iv. exposing said sacrificial layer of photoablatable material to a radiant energy of electromagnetic radiation transmitted through said optically transparent metal, alloy or metal oxide to provide laser ablation sufficient to remove an ablated portion of said sacrificial layer of photoablatable material, wherein said ablated portion does not extend the entire thickness of said sacrificial layer of photoablatable material, thereby lifting off said conductive material deposited on said sacrificial layer of photoablatable material; and v. exposing said sacrificial layer of photoablatable material having said ablated portion to a solvent capable of dissolving said sacrificial layer of photoablatable material, thereby generating said pattern of structures of said conductive material on said substrate.

28. The method of claim 27 wherein said ablated portion extends from a surface of said sacrificial layer of photoablatable material in contact with said thin film of the conductive material a distance greater than or equal to 100 nanometers into said layer.

29. The method of claim 27 wherein said ablated portion of said sacrificial layer of photoablatable material extends between about 10% and about 50% of the entire thickness of said layer.

30. A method for generating a pattern of structures of an optically transparent conductive material on a display device substrate, said method comprising the steps of:
  i. providing a sacrificial layer of photoablatable material on at least a portion of said display device substrate, wherein said sacrificial layer of photoablatable material is a photoablatable polymer;
  ii. removing photoablatable material from selected regions of said sacrificial layer of photoablatable material via laser ablation; thereby generating a deposition mask having a pattern of recessed features providing exposed regions of said display device substrate and regions of said display device substrate masked by said sacrificial layer of photoablatable material;
  iii. depositing said optically transparent conductive material on at least a portion of said exposed regions of said display device substrate, wherein said optically transparent conductive material is an optically transparent metal, alloy or metal oxide; and
  iv. exposing said sacrificial layer of photoablatable material to electromagnetic radiation transmitted through said optically transparent metal, alloy or metal oxide that provides for at least partial laser ablation of said sacrificial layer of photoablatable material, wherein at least partial laser ablation of said sacrificial layer of photoablatable material selectively lifts off the portion of said optically transparent conductive material provided on said sacrificial layer of photoablatable material and does not remove the optically transparent conductive material provided on the exposed regions of the substrate, thereby generating said pattern of structures of said optically transparent conductive material on said display device substrate.

31. The method of claim 30 wherein said optically transparent conductive material is selected from the group consisting of an indium tin oxide thin film, an indium oxide thin film, a tin oxide thin film, a doped tin oxide thin film, a doped indium oxide thin film, a carbon thin film and a doped zinc oxide thin film.

32. The method of claim 30 wherein said display device substrate supports thin film transistor electronic device components, and wherein said structures of said optically transparent conductive material of said pattern are positioned such that they are spatially aligned, in electrical contact or both with one or more thin film transistor electronic device components of said display device substrate.

33. The method of claim 32 wherein said structures of said optically transparent conductive material of said pattern are positioned such that they are in electrical contact with one or more drain electrodes of said display device substrate.

34. The method of claim 32 wherein said structures of said optically transparent conductive material of said pattern are supported in part by a passivation layer of said display device.

35. The method of claim 30 wherein the photoablatable material is selected to undergo photoablation at a wavelength at which the optically transparent material is transmissive.

36. The method of claim 30 comprising a method of making a device selected from the group consisting of a thin film transistor—liquid crystal display device, an organic light emitting display device, a plasma display panel device, a sensor, a sensor array, a microfluidic system, a nanofluidic system, a nanoelectromechanical system and a microelectromechanical system.

* * * * *